US012641768B2

(12) United States Patent
Lin et al.

(10) Patent No.: US 12,641,768 B2
(45) Date of Patent: May 26, 2026

(54) SEMICONDUCTOR MEMORY DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Bo-Rong Lin, Hsinchu (TW); Kuo-Cheng Chiang, Hsinchu (TW); Shi-Ning Ju, Hsinchu (TW); Guan-Lin Chen, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 609 days.

(21) Appl. No.: 17/892,364

(22) Filed: Aug. 22, 2022

(65) Prior Publication Data

US 2024/0064952 A1     Feb. 22, 2024

(51) Int. Cl.
H01L 21/3213    (2006.01)
H10B 10/00    (2023.01)
(Continued)

(52) U.S. Cl.
CPC ..... H10B 10/125 (2023.02); H01L 21/32137 (2013.01); H01L 21/32139 (2013.01); H10B 10/00 (2023.02); H10B 10/12 (2023.02); H10D 30/014 (2025.01); H10D 30/024 (2025.01); H10D 30/031 (2025.01); H10D 30/43 (2025.01); H10D 30/6211 (2025.01); H10D 30/6735 (2025.01); H10D 30/6757 (2025.01);
(Continued)

(58) Field of Classification Search
CPC ...... H10B 10/125; H10B 10/00; H10B 10/12; H01L 21/32137; H01L 21/32139; H10D 30/014; H10D 30/024; H10D 30/031; H10D 30/43; H10D 30/6211; H10D 30/6735; H10D 30/6757; H10D 62/121; H10D 64/017; H10D 64/018; H10D 62/822
See application file for complete search history.

(56) References Cited

U.S. PATENT DOCUMENTS

| | | | | |
|---|---|---|---|---|
| 10,068,982 | B2 * | 9/2018 | Chang | H10D 84/0188 |
| 2016/0276355 | A1 * | 9/2016 | Zhang | H01L 23/5252 |

(Continued)

*Primary Examiner* — William B Partridge
*Assistant Examiner* — Erik A. Anderson
(74) *Attorney, Agent, or Firm* — Birch, Stewart, Kolasch & Birch, LLP

(57) ABSTRACT

A semiconductor memory device includes a first dielectric wall, a second dielectric wall, first channel portions, second channel portions, an isolation wall, and a dielectric feature. The second dielectric wall is spaced apart from the first dielectric wall in a first direction. The first channel portions are disposed on a side of the first dielectric wall and are spaced apart from each other in a second direction transverse to the first direction. The second channel portions are disposed on a side of the second dielectric wall and are spaced apart from each other in the second direction. The isolation wall is located between the first dielectric wall and the second dielectric wall. The dielectric feature is disposed to separate the first dielectric wall and the isolation wall, and is disposed on the other side of the first dielectric wall opposite to the first channel portions in the first direction.

20 Claims, 19 Drawing Sheets

(51) Int. Cl.

| | | |
|---|---|---|
| *H10D 30/01* | (2025.01) | |
| *H10D 30/43* | (2025.01) | |
| *H10D 30/62* | (2025.01) | |
| *H10D 30/67* | (2025.01) | |
| *H10D 62/10* | (2025.01) | |
| *H10D 64/01* | (2025.01) | |

(52) U.S. Cl.

CPC ......... *H10D 62/121* (2025.01); *H10D 64/017* (2025.01); *H10D 64/018* (2025.01)

(56) References Cited

U.S. PATENT DOCUMENTS

| | | | |
|---|---|---|---|
| 2017/0012042 A1* | 1/2017 | Cai | H10D 84/834 |
| 2017/0365692 A1* | 12/2017 | Leobandung | H10D 30/6211 |
| 2019/0267211 A1* | 8/2019 | Pan | H01L 21/0212 |
| 2020/0152516 A1* | 5/2020 | Chen | H10D 84/0158 |
| 2020/0258744 A1* | 8/2020 | Thareja | H01L 21/76897 |
| 2020/0381257 A1* | 12/2020 | Lin | H10D 64/62 |
| 2021/0057285 A1* | 2/2021 | Huang | H10D 30/62 |
| 2021/0257480 A1* | 8/2021 | Jhan | H01L 21/02532 |

\* cited by examiner

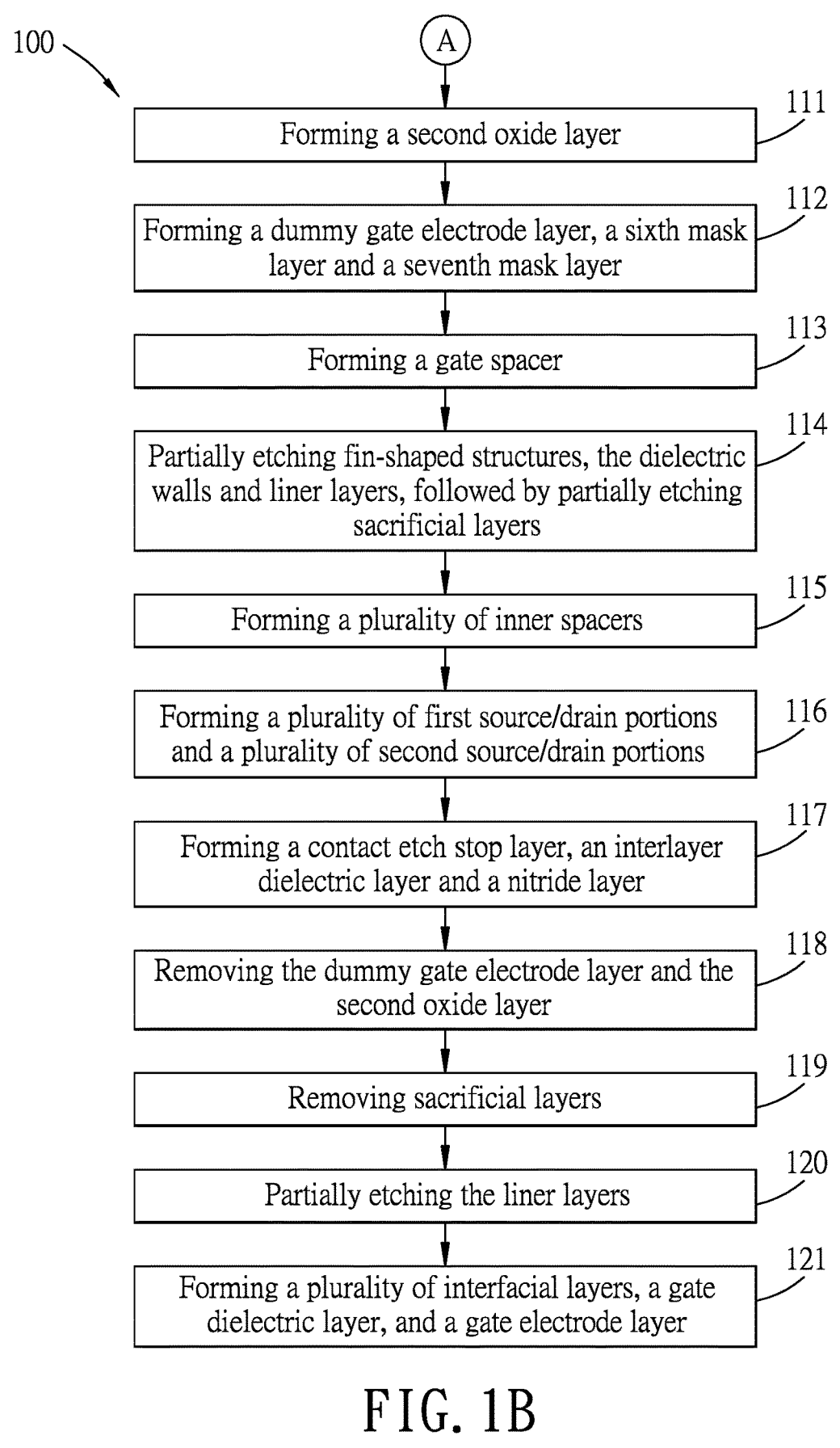

100

(A)

| 111 |
|---|
| Forming a second oxide layer |

| 112 |
|---|
| Forming a dummy gate electrode layer, a sixth mask layer and a seventh mask layer |

| 113 |
|---|
| Forming a gate spacer |

| 114 |
|---|
| Partially etching fin-shaped structures, the dielectric walls and liner layers, followed by partially etching sacrificial layers |

| 115 |
|---|
| Forming a plurality of inner spacers |

| 116 |
|---|
| Forming a plurality of first source/drain portions and a plurality of second source/drain portions |

| 117 |
|---|
| Forming a contact etch stop layer, an interlayer dielectric layer and a nitride layer |

| 118 |
|---|
| Removing the dummy gate electrode layer and the second oxide layer |

| 119 |
|---|
| Removing sacrificial layers |

| 120 |
|---|
| Partially etching the liner layers |

| 121 |
|---|
| Forming a plurality of interfacial layers, a gate dielectric layer, and a gate electrode layer |

FIG. 1B

SEMICONDUCTOR MEMORY DEVICE AND METHOD FOR MANUFACTURING THE SAME

BACKGROUND

In the integrated circuit (IC) industry, semiconductor memory devices (for example, Static Random Access Memory (SRAM)) with forksheet structures have better electrical performance (for example, gate-to-drain capacitance, etc.) due to structural characteristics, such as reduced spacing between transistors of different conductivity types, reduced area of metal gates, and reduced lateral size of semiconductor epitaxial layers disposed in source/drain regions. However, the electrical performance of the semiconductor memory device with the forksheet structure may be adversely affected by some fabrication process variations (for example, an overlay shift in the photolithography process). Thus, the IC industry strives to reduce these process variations to improve the electrical performance of the semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B are flow diagrams illustrating a method for manufacturing a semiconductor memory device in accordance with some embodiments.

DETAILED DESCRIPTION

Figure 1A:
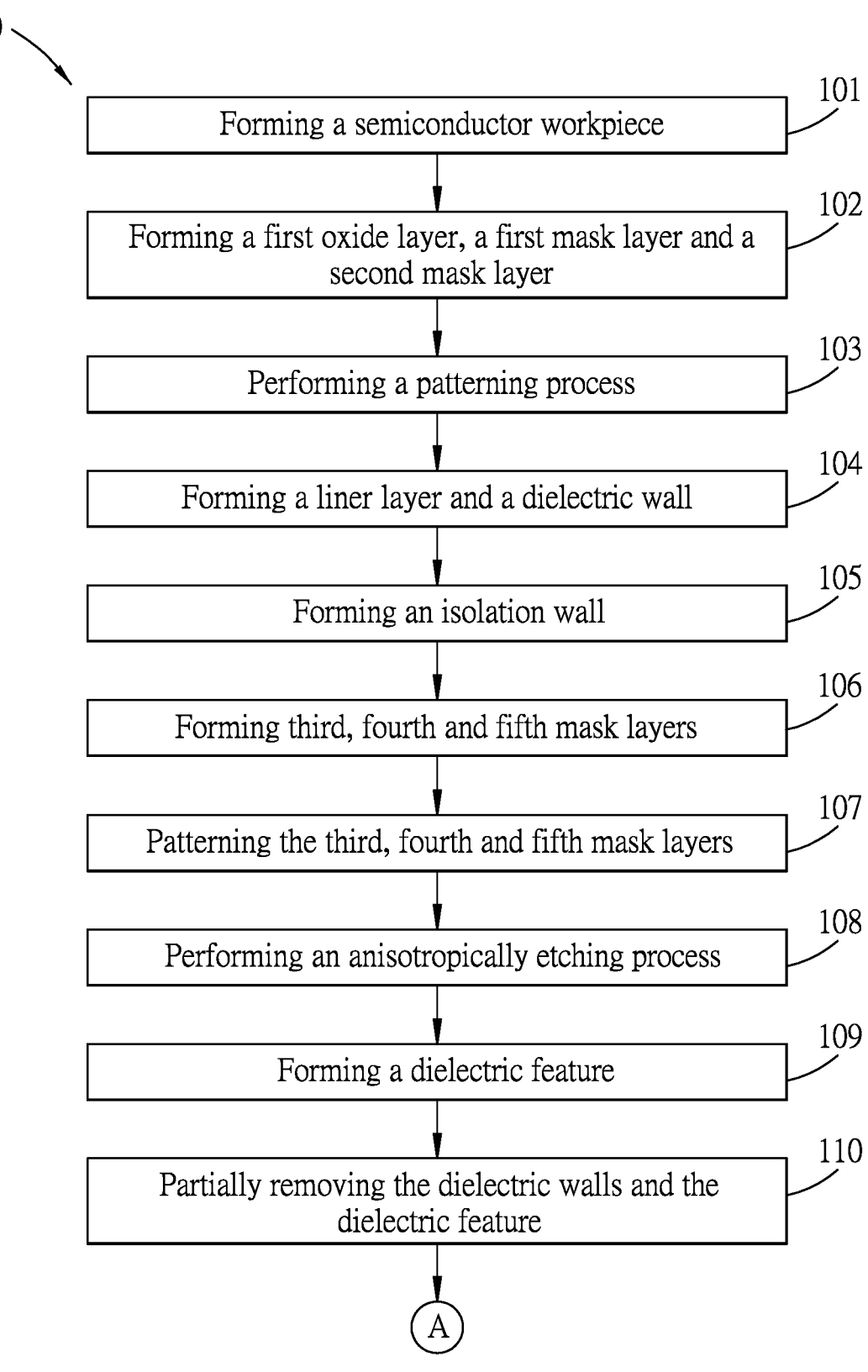

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "above," "below," "proximate," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be noted that the element(s) or feature(s) are exaggeratedly shown in the figures for the purposed of convenient illustration and are not in scale.

An integrated circuit (IC) may include memory devices (for example, Static Random Access Memory (SRAM)) and logic devices (for example, input/output devices) that are located in a memory region and in a logic region, respectively. The process for manufacturing the IC may include a step of simultaneously etching semiconductor memory structures used for forming the memory devices and semiconductor logic structures used for forming the logic devices. Such an etching process (namely, cut oxide definition (COD) process) may damage a dielectric wall located between two adjacent semiconductor memory structures, which may adversely affect electrical performance (for example, the capacitance) of the memory devices.

The present disclosure is directed to a semiconductor memory device and a method for manufacturing the same. FIGS. 1A and 1B are flow diagrams illustrating a method 100 for manufacturing a semiconductor memory device (for example, a semiconductor memory device 200 shown in FIG. 22) in accordance with some embodiments. FIGS. 2 to 22 illustrate schematic views of the intermediate stages of the method 100.

Figure 2:
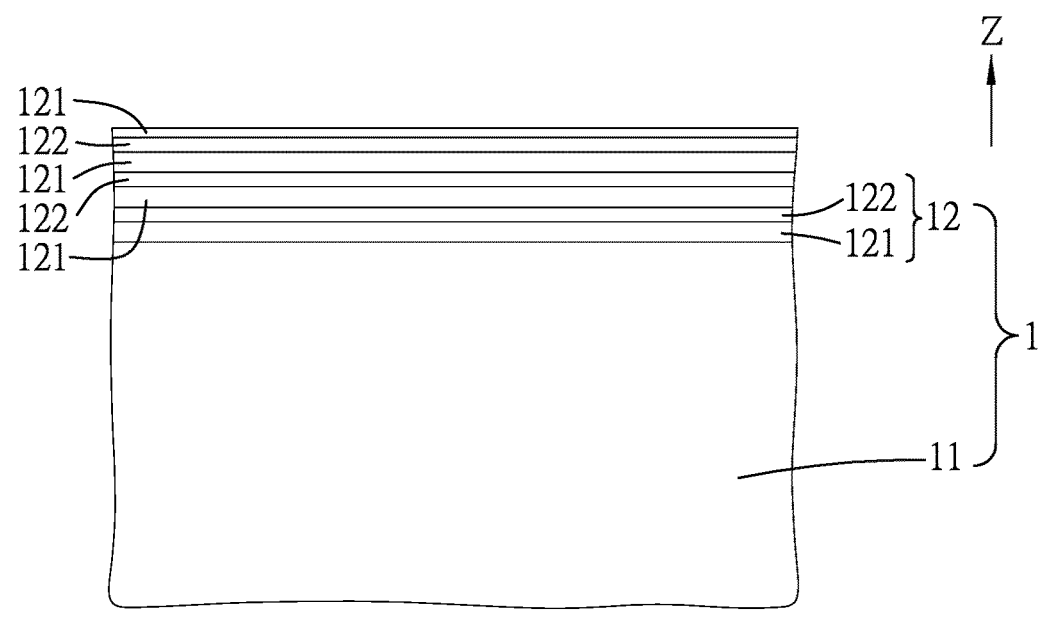
FIGS. 2 to 22 are schematic views illustrating intermediate stages of a method for manufacturing a semiconductor memory device in accordance with some embodiments.

Referring to FIGS. 1A and 2, the method 100 begins at step 101, where a semiconductor workpiece 1 is formed. The semiconductor workpiece 1 includes a semiconductor substrate 11 and a semiconductor stack 12 disposed on the semiconductor substrate 11 in a Z direction. In some embodiments, the semiconductor substrate 11 may include, but are not limited to, an elemental semiconductor or a compound semiconductor. The elemental semiconductor includes a single species of atoms, such as silicon (Si) or germanium (Ge) from column XIV of the periodic table, and may be crystalline, polycrystalline, or amorphous in structure. Other suitable materials for the elemental semiconductor are within the contemplated scope of the present disclosure. The compound semiconductor includes two or more elements, and examples thereof may include, but are not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInP), aluminum gallium arsenide (AlGaAs), gallium indium arsenide (GaInAs), gallium indium phosphide (GaInP), and gallium indium arsenide phosphide (GaInAsP). Other suitable materials for the compound semiconductor are within the contemplated scope of the present disclosure. The compound semiconductor may have a gradient feature in which the compositional ratio thereof changes from one location to another location in the compound semiconductor. The compound semiconductor may be formed over a silicon substrate and may be strained. In some embodiments, the semiconductor substrate 11 may include a multilayer compound semiconductor structure. In some embodiments, the semiconductor stack 12 includes a plurality of sacrificial layers 121 and a plurality of channel layers 122 which are alternately stacked on the semiconductor substrate 11. The sacrificial layers 121 may include silicon germanium (SiGe). Other suitable materials for the sacrificial layers 121 are within the contemplated scope of the present disclosure. The channel layers 122 may include silicon (Si). Other suitable materials for the channel layers 122 are within the contemplated scope of the present disclosure. The sacrificial layers 121 and the channel layers 122 may be formed by a suitable deposition process, for example, but are not limited to, chemical vapor deposition (CVD) (e.g., ultra-high vacuum CVD (UHV-CVD)), or other suitable deposition processes. In some embodiments, the sacrificial layers 121 and the channel layers 122 may be formed by a suitable epitaxial process, for example, but not limited to, molecular beam epitaxy (MBE) or other suitable epitaxial processes. In some embodiments, the semiconductor workpiece 1 is located in a memory area of an integrated circuit (IC) (not shown). The IC may further include a logic area for growing a plurality of logic devices (not shown).

Figure 3:
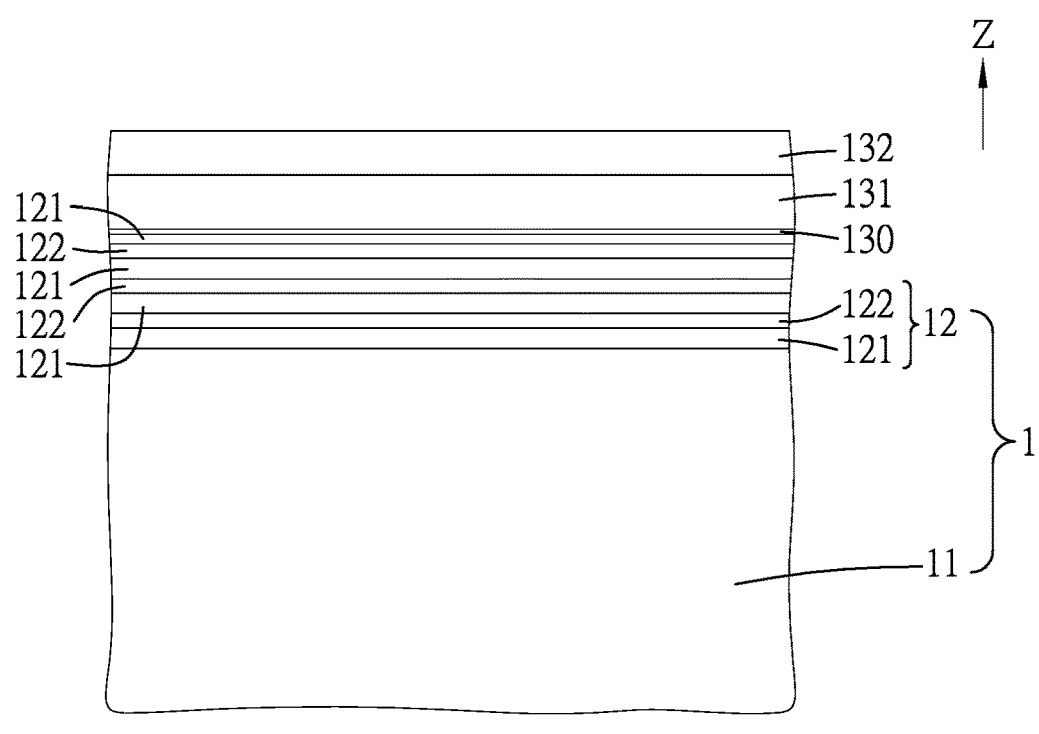

Referring to FIGS. 1A and 3, the method 100 then proceeds to step 102, where a first oxide layer 130, a first mask layer 131, and a second mask layer 132 are sequentially formed on the semiconductor workpiece 1 in the Z direction. The first oxide layer 130 may include silicon oxide. Other suitable materials for the first oxide layer 130 are within the contemplated scope of the present disclosure. The first oxide layer 130 may be formed by a suitable deposition process, for example, but not limited to, CVD, atomic layer deposition (ALD), or other suitable deposition processes. The first mask layer 131 may be made of a nitride-based material (for example, silicon nitride). The second mask layer 132 may be made of an oxide-based material (for example, silicon oxide). Other suitable materials for the first mask layer 131 and the second mask layer 132 are within the contemplated scope of the present disclosure. The first mask layer 131 and the second mask layer 132 may be formed by a suitable deposition process, for example, but not limited to, CVD (e.g., plasma-enhanced CVD (PECVD)), ALD (e.g., plasma-enhanced ALD (PEALD)), or other suitable deposition processes.

Figure 4:
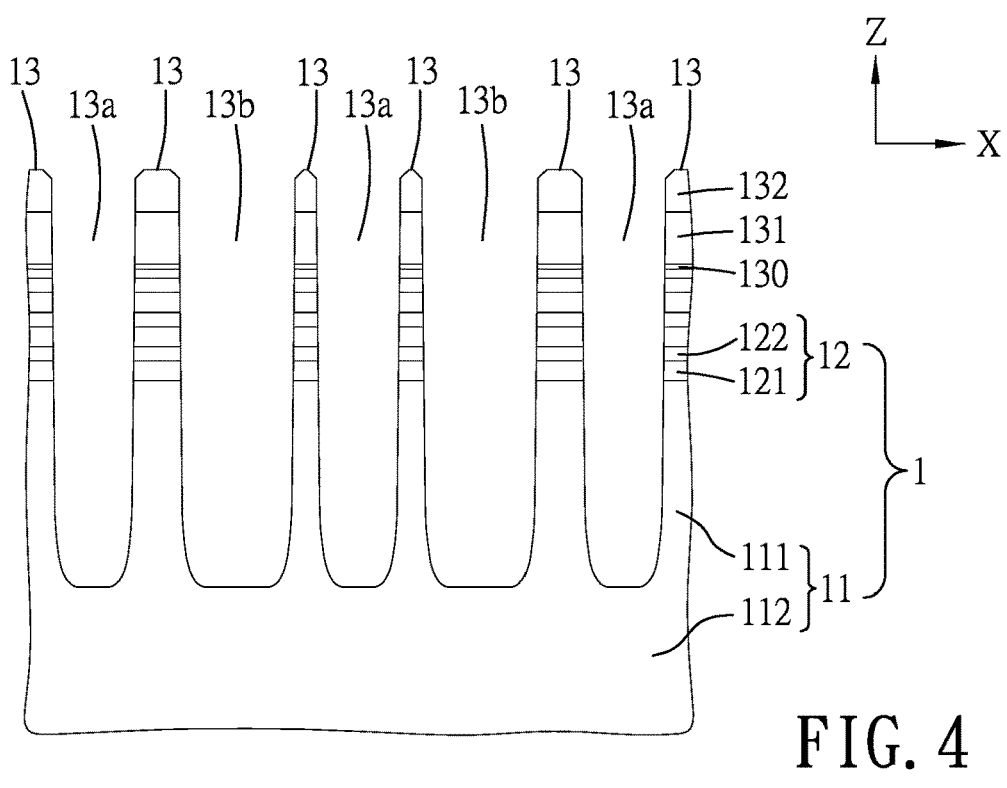

Referring to FIGS. 1A and 4, the method 100 then proceeds to step 103, where the structure of FIG. 3 is patterned to form a plurality of fin-shaped structures 13 that are spaced apart from each other by trenches in an X direction transverse to the Z direction. Step 103 may be performed by a photolithography process. The etching process may be performed using, for example, but not limited to, an anisotropically etching process (for example, dry etching) or other suitable anisotropically etching processes. In some embodiments, the anisotropically etching process may be a gas plasma etching process. In some embodiments, the gas plasma etching process may be performed using a source gas, for example, but not limited to, sulfur fluorine (SFx), chlorine (Clx), or fluoromethane (CHFx). In some embodiments, a gas flow rate in the gas plasma etching process may range from about 1 sccm to about 450 sccm. In some embodiments, the gas plasma etching process may be performed at a temperature ranging from about 20° C. to about 80° C. In some embodiments, the gas plasma etching process may be performed under a pressure ranging from about 1 mTorr to about 40 mTorr. Each of the trenches may penetrate through the second mask layer 132, the first mask layer 131, the first oxide layer 130, the semiconductor stack 12, and an upper portion 111 of the semiconductor substrate 11, and terminate at a lower portion 112 of the semiconductor substrate 11. The trenches may be divided into a plurality of wall trenches 13a and a plurality of isolation trenches 13b that are spaced apart from each other and that are alternately arranged in the X direction. In some embodiments, each of the fin-shaped structures 13 is located between one of the wall trenches 13a and one of the isolation trenches 13b that is proximate to the one of the wall trenches 13a.

Figure 5:
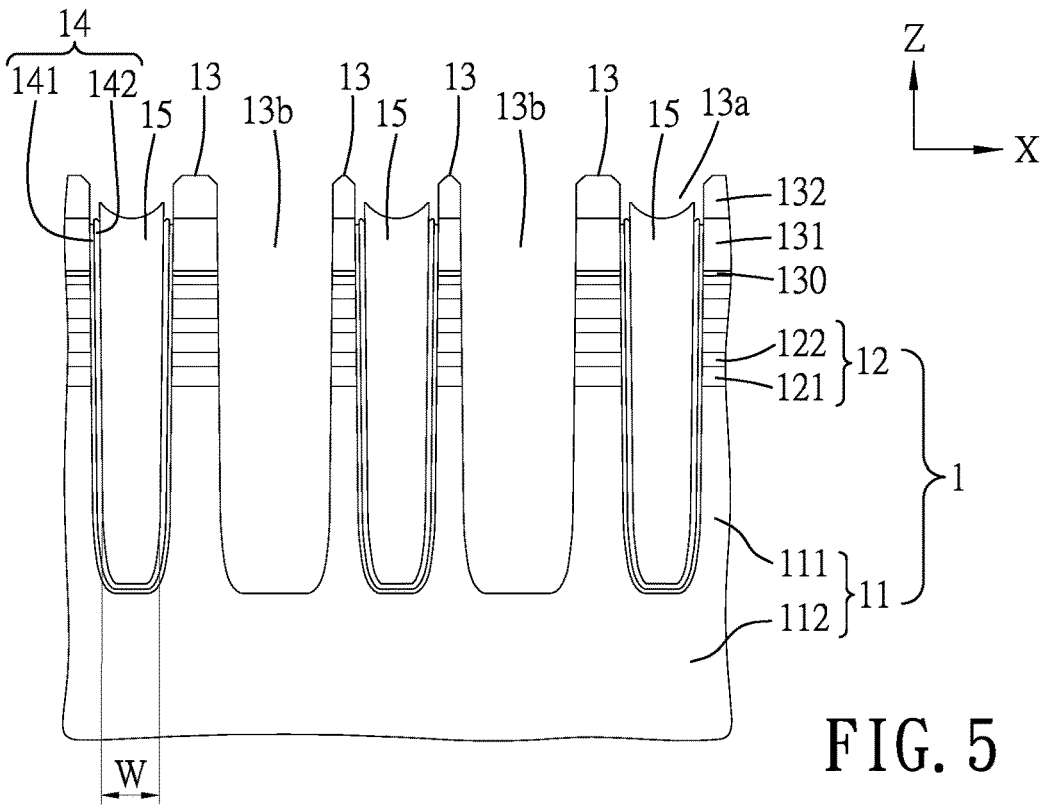

Referring to FIGS. 1A and 5, the method 100 then proceeds to step 104, where a liner layer 14 and a dielectric wall 15 are sequentially formed in a respective one of the wall trenches 13a. Step 104 may include (i) conformally and sequentially depositing a liner material layer (not shown) and a dielectric material layer (not shown) in a respective one of the wall trenches 13a by a suitable deposition process, for example, but not limited to, CVD (e.g., low-pressure CVD (LPCVD)), ALD, or other suitable deposition processes, and (ii) isotropically etching back the liner material layer and the dielectric material layer, so as to form the liner layer 14 and the dielectric wall 15 in the respective one of the wall trenches 13a. The liner material layer for forming the liner layer 14 may include silicon nitride, silicon oxide, silicon oxynitride, silicon carbonitride, silicon oxycarbide, silicon oxycarbonitride, or combinations thereof. Other suitable materials for the liner layer 14 are within the contemplated scope of the present disclosure. In some embodiments, the liner layer 14 may include a first liner layer 141 disposed in the respective one of the wall trenches 13a and along sidewalls of two adjacent fin-shaped structures 13, and a second liner layer 142 disposed on the first liner layer 141 and in the respective one of the wall trenches 13a. The first liner layer 141 and the second liner layer 142 may be made of different materials. The dielectric wall 15 is disposed on the second liner layer 142 in the respective one of the wall trenches 13a. The dielectric material layer for forming the dielectric wall 15 may include an oxide-based material, silicon nitride, silicon carbonitride, silicon oxycarbonitride, silicon oxycarbide, or combinations thereof. Other suitable materials for the dielectric wall 15 are within the contemplated scope of the present disclosure. In some embodiments, the dielectric wall 15 may have a width (w) ranging from about 10 nm to about 100 nm. In some embodiments, the dielectric wall 42 may have a concave upper surface caused by isotropically etching the dielectric material layer. In some embodiments, the liner layer 14 may be made of a material that has a high etching selectivity with respect to the dielectric wall 15. That is, for a suitable kind of etchant, the liner layer 14 can be readily etched, while the dielectric wall 15 is left slightly etched or substantially unetched.

Figure 6:
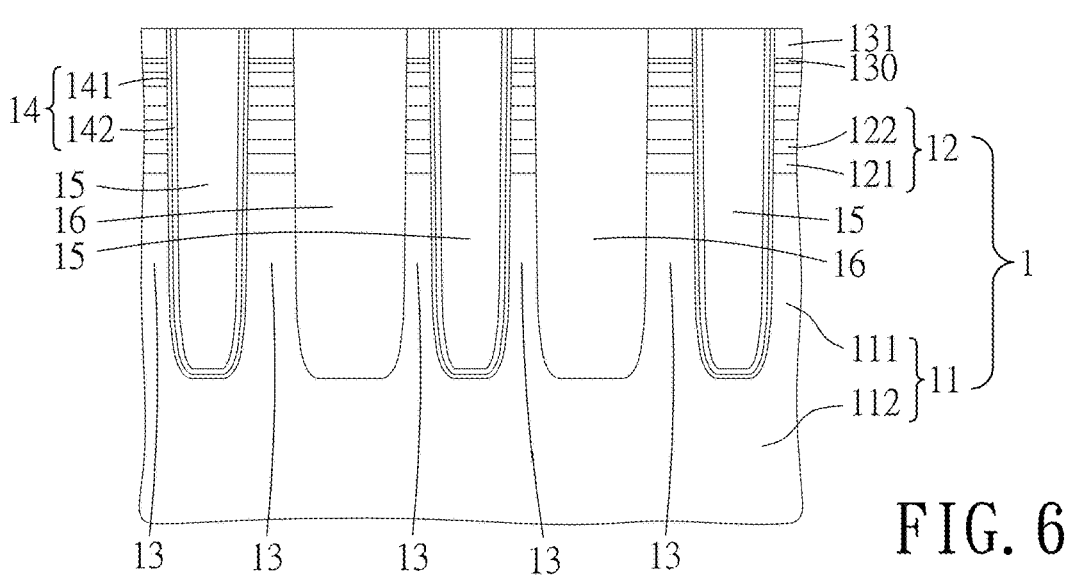

Referring to FIGS. 1A and 6, the method 100 then proceeds to step 105, where an isolation wall 16 is formed in a respective one of the isolation trenches 13b. Step 105 may include (i) depositing a dielectric material layer (not shown) over the structure of FIG. 5 and in the isolation trenches 13b (see FIG. 5) by a suitable deposition process, for example, but not limited to, CVD, ALD, spin-on coating, or other suitable deposition processes, and (ii) conducting a planarization process, for example, but not limited to, a chemical mechanical polishing (CMP) process or other suitable planarization processes, to remove the dielectric material layer on the second mask layer 132, the second mask layer 132, and portions of the first mask layer 131, the liner layer 14 and the dielectric wall 15 in the respective one of the wall trenches 13a, so as to obtain the isolation wall 16 in the respective one of the isolation trenches 13b. The dielectric material layer for forming the isolation wall 16 may include silicon oxide, silicon nitride, silicon oxynitride, a low dielectric constant (k) material, a high-k material, or combinations thereof. Other suitable materials for the isolation wall 16 are within the contemplated scope of the present disclosure.

In some embodiments, after formations of the liner layer 14 and the dielectric wall 15 (i.e., process 104 in the flow chart 100 shown in FIG. 1A), and before formation of the isolation wall 16 (i.e., process 105 in the flow chart 100 shown in FIG. 1A), a photoresist layer (not shown) is deposited over and covers the structure of FIG. 5, and an etching process (may be referred to as a first cut oxide definition (COD-1) process) is then conducted on the structure of FIG. 5 covered by the photoresist layer in the memory area of the IC and on logic structures (not shown) for forming the logic devices in the logic area of the IC. In such a case, the structure of FIG. 5 that is covered by the photoresist layer is not etched in the COD-1 process. After the COD-1 process, the photoresist layer may be removed using, for example, but not limited to, a dry etching process, a wet etching process, other suitable processes, or combinations thereof.

Figure 7:
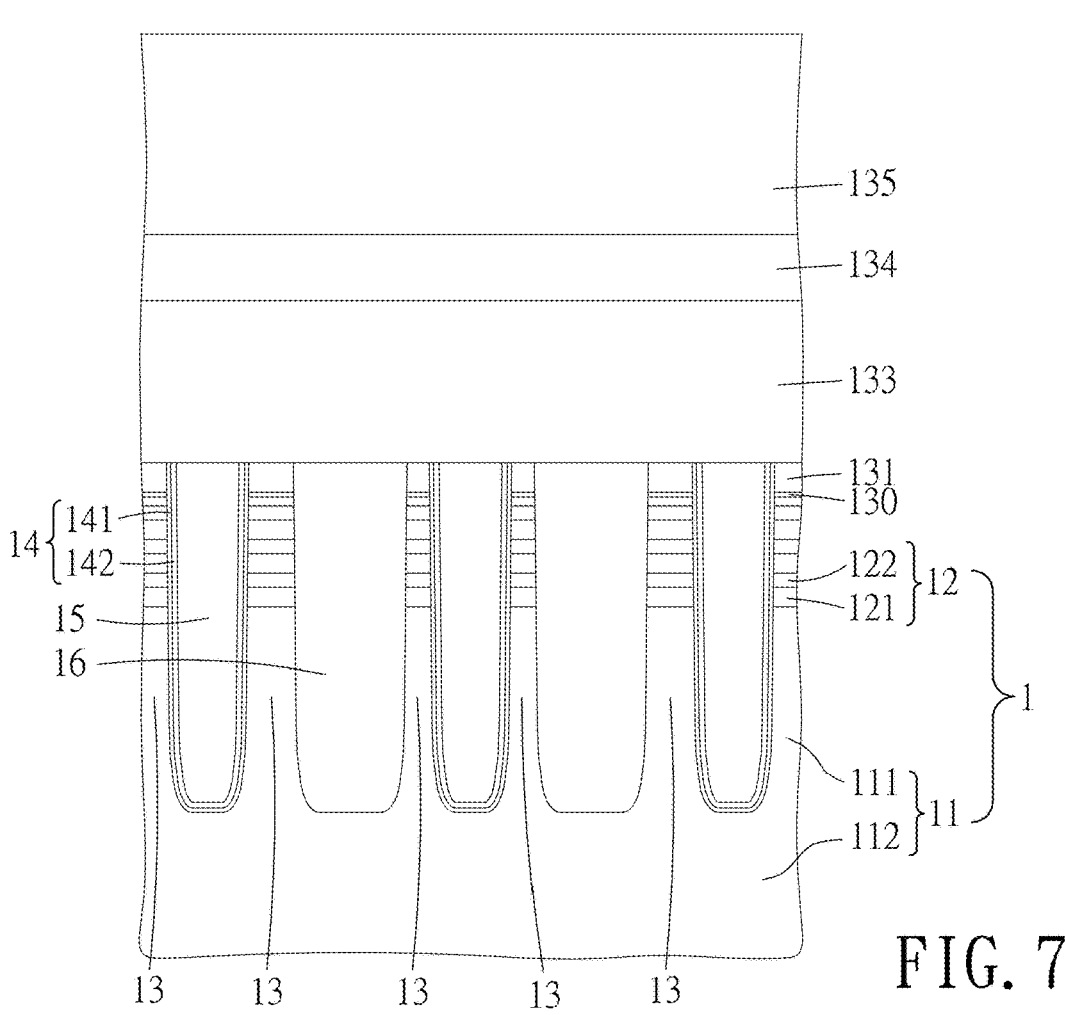

Referring to FIGS. 1A and 7, the method 100 then proceeds to step 106, where third, fourth and fifth mask layers 133, 134, 135 are sequentially formed on the structure of FIG. 6. Each of the third, fourth and fifth mask layers 133, 134, 135 may be made of organosilicate (SiOCH)-based material. Each of the third, fourth and fifth mask layers 133, 134, 135 may be formed by a suitable deposition process, for example, but not limited to, spin-on coating or other suitable deposition processes. In some embodiments, each of the third, fourth and fifth mask layers 133, 134, 135 may have different silicon concentrations. For example, the fourth mask layer 134 may have a silicon concentration that is higher than that of each of the third and fifth mask layers 133, 135, and may function as a hard mask.

Figure 8:
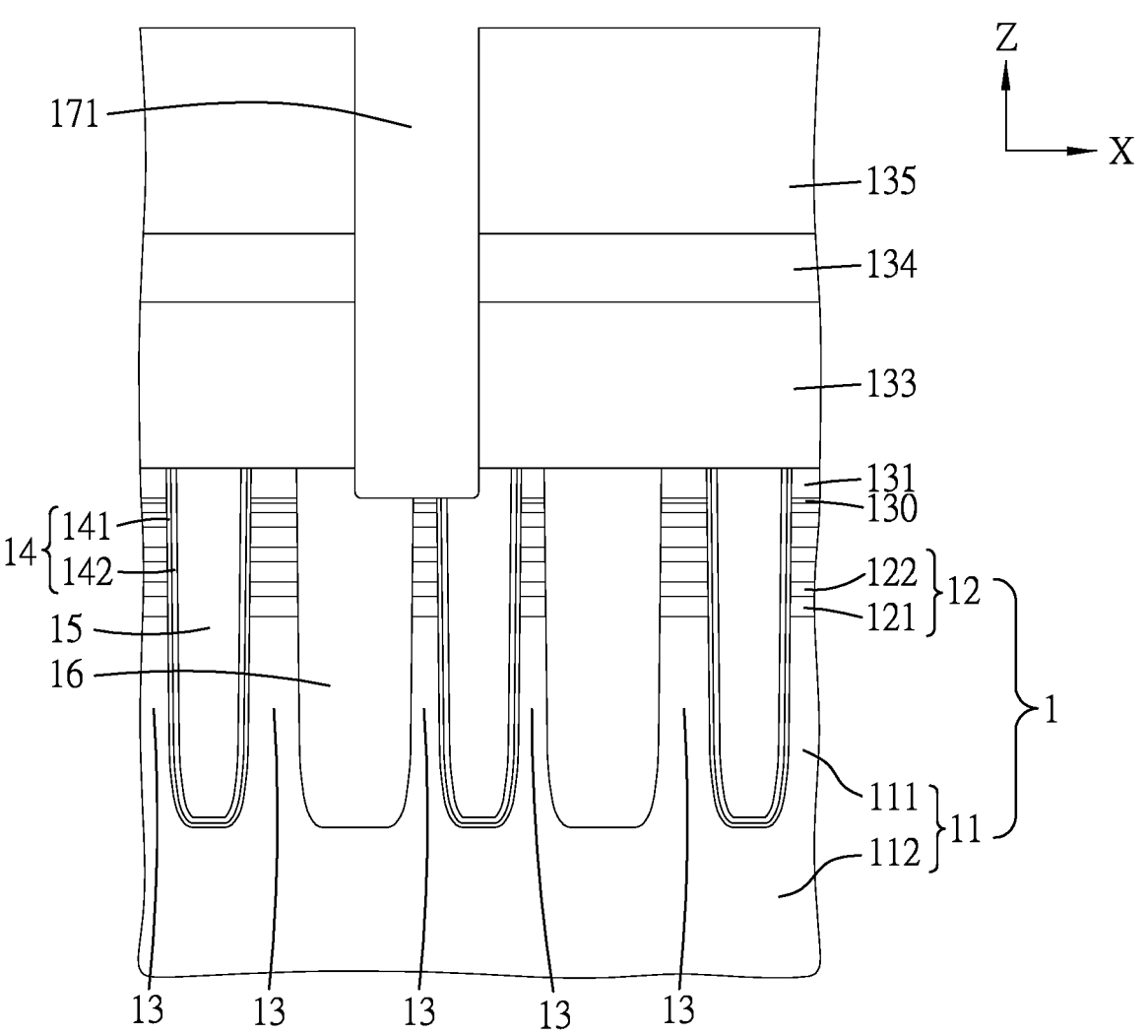

Referring to FIGS. 1A and 8, the method 100 then proceeds to step 107, where the third, fourth and fifth mask layers 133, 134, 135 are patterned to form a first through hole 171. Step 107 may be performed by a photolithography process. In some embodiments, the etching process performed in this step may be an anisotropically process (for example, a gas plasma etching process). In some embodiments, the gas plasma etching process may be performed using a source gas, for example, but not limited to, sulfur oxide ($SO_x$), fluorinated hydrocarbon ($CH_xF_y$), or argon (Ar). In some embodiments, a gas flow rate of the source gas used in the gas plasma etching process may range from about 10 sccm to about 500 sccm. In some embodiments, the plasma generation power used in the gas plasma etching process may range from about 500 W to about 900 W. In some embodiments, the gas plasma etching process may be performed under a pressure that is greater than about 20 mTorr. In some embodiments, the gas plasma etching processing time may be greater than about 15 seconds. The first through hole 171 penetrates the third, fourth and fifth mask layers 133, 134, 135 to expose a portion of a corresponding one of the isolation walls 16, a portion of a corresponding one of the fin-shaped structures 13 that is adjacent to the corresponding one of the isolation walls 16, a portion of a corresponding one of the liner layers 14 that is separated from the corresponding one of the isolation walls 16 by the corresponding one of the fin-shaped structures 13, and a corresponding one of the dielectric walls 15 that is separated from the corresponding one of the fin-shaped structures 13 by the corresponding one of the liner layers 14.

Figure 9:
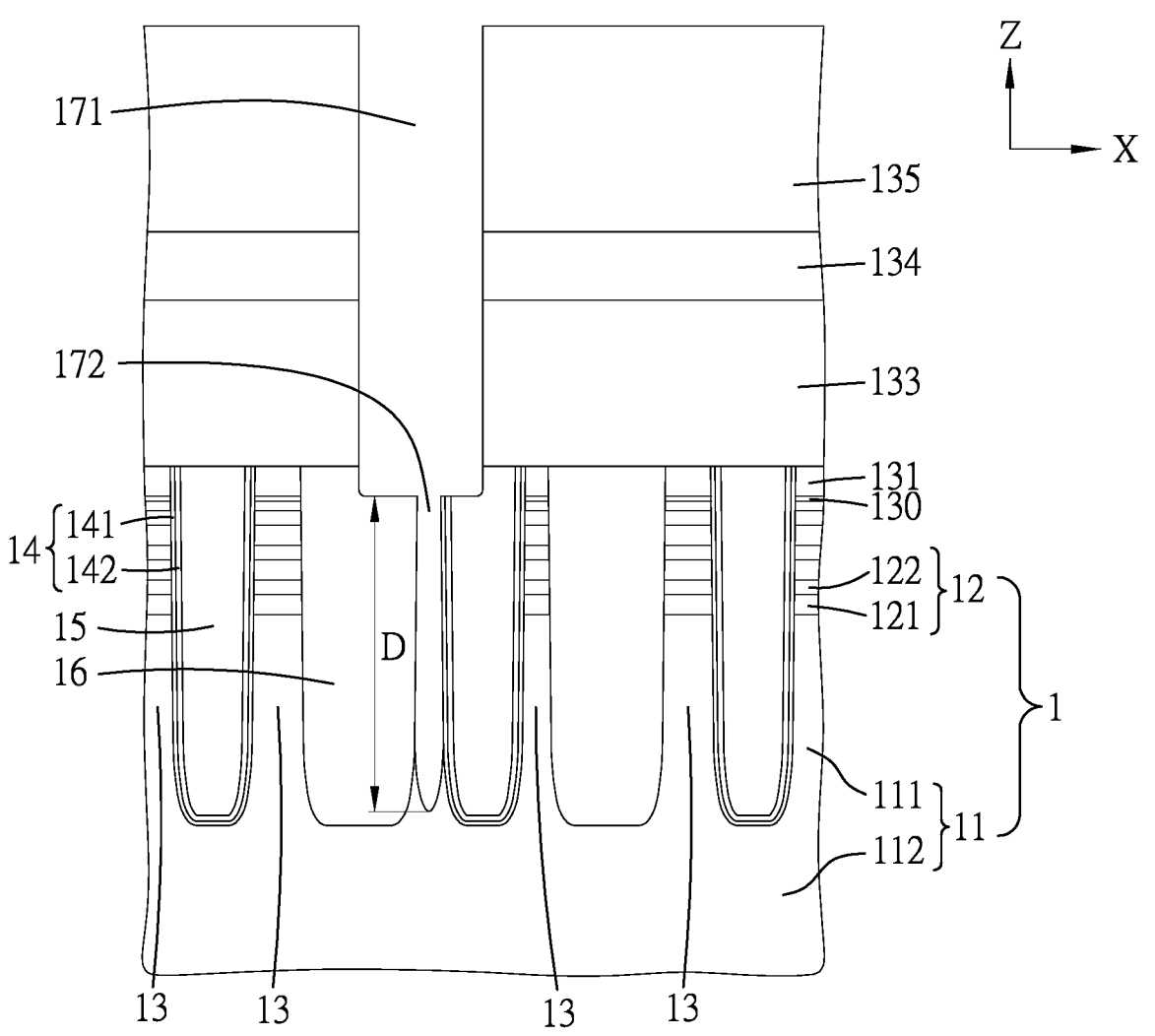

Referring to FIGS. 1A and 9, the method 100 then proceeds to step 108, where the portion of the corresponding one of the fin-shaped structure 13 exposed from the first through hole 171 is removed to form a second through hole 172. Step 108 may be performed by an anisotropically etching process (for example, dry etching). In some embodiments, the anisotropically etching process performed in this step may be a gas plasma etching process. In some embodiments, the gas plasma etching process may be performed using a source gas, for example, but not limited to, sulfur oxide ($SO_x$), fluorinated hydrocarbon ($CH_xF_y$), or argon (Ar). In some embodiments, a gas flow rate of the source gas used in the gas plasma etching process may range from about 10 sccm to about 500 sccm. In some embodiments, the plasma generation power used in the gas plasma etching process may range from about 500 W to about 900 W. In some embodiments, the gas plasma etching process may be performed under a pressure ranging from about 10 mTorr to about 70 mTorr. In some embodiments, the gas plasma etching processing time may be greater than about 60 seconds. The second through hole 172 may have a depth (D) ranging from about 10 nm to about 100 nm. The second through hole 172 is in spatial communication with the first through hole 171. The processes 107 and 108 may be collectively referred to as a second cut oxide definition (COD-2) process.

Figure 10A:
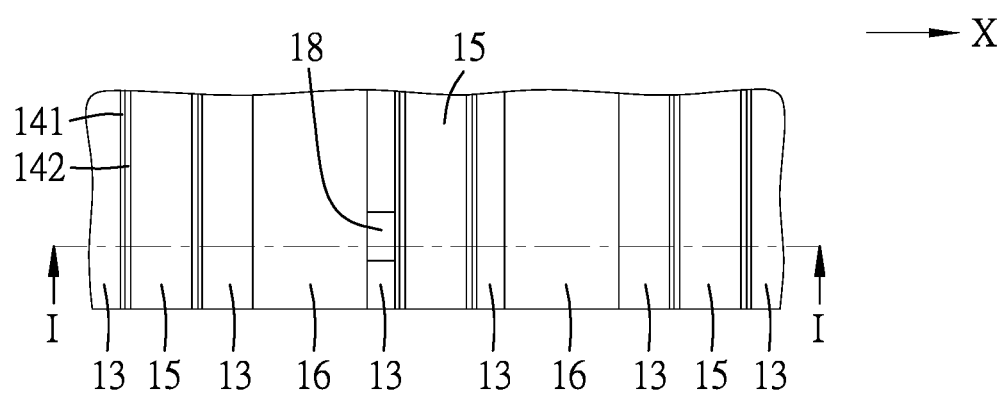
Figure 10B:
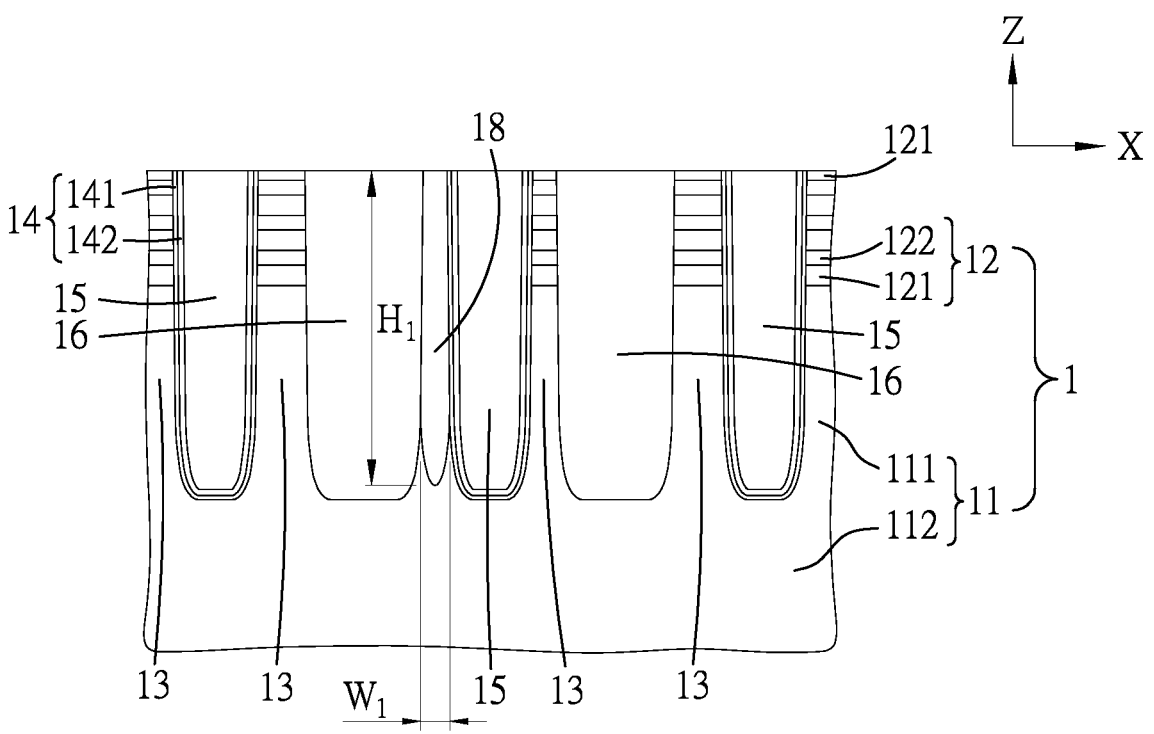

Referring to FIGS. 1A, 10A and 10B, the method 100 then proceeds to step 109, where a dielectric feature 18 is formed to fill the second through hole 72 (see FIG. 9). FIG. 10B illustrates a fragmentary cross-sectional view taken along line I-I of FIG. 10A. Step 109 may include (i) depositing a dielectric material layer (not shown) over the structure of FIG. 9 to fill the second through hole 172 by a suitable deposition process, for example, but not limited to, CVD, ALD, spin-on coating, or other suitable deposition processes, and (ii) conducting a planarization process, for example, but not limited to, a CMP process or other suitable planarization processes, to planarize the dielectric material layer and the structure of FIG. 9 until an upper surface of the uppermost one of the sacrificial layers 121 is exposed, so as to obtain the dielectric feature 18. The dielectric feature 18 is located between the corresponding one of the isolation walls 16 and the corresponding one of the dielectric walls 15 in the X direction. The dielectric feature 18 may include an oxide-based material, silicon nitride, silicon carbonitride, silicon oxycarbonitride, or silicon oxycarbide. Other suitable materials for the dielectric feature 18 are within the contemplated scope of the present disclosure. In some embodiments, the dielectric feature 18 may have seam(s) or void(s). The dielectric feature 18 may have a height ($H_1$) ranging from about 10 nm to about 100 nm (equal to the depth (D) of the second through hole 172 (see FIG. 9)), and may have a width ($W_1$) ranging from about 10 nm to about 100 nm. In some embodiments, the width ($W_1$) of the dielectric feature 18 may be similar to a critical dimension (i.e., the length of a channel layer 122) of a p-type field effect transistor (which will be described hereinafter).

Figure 11:
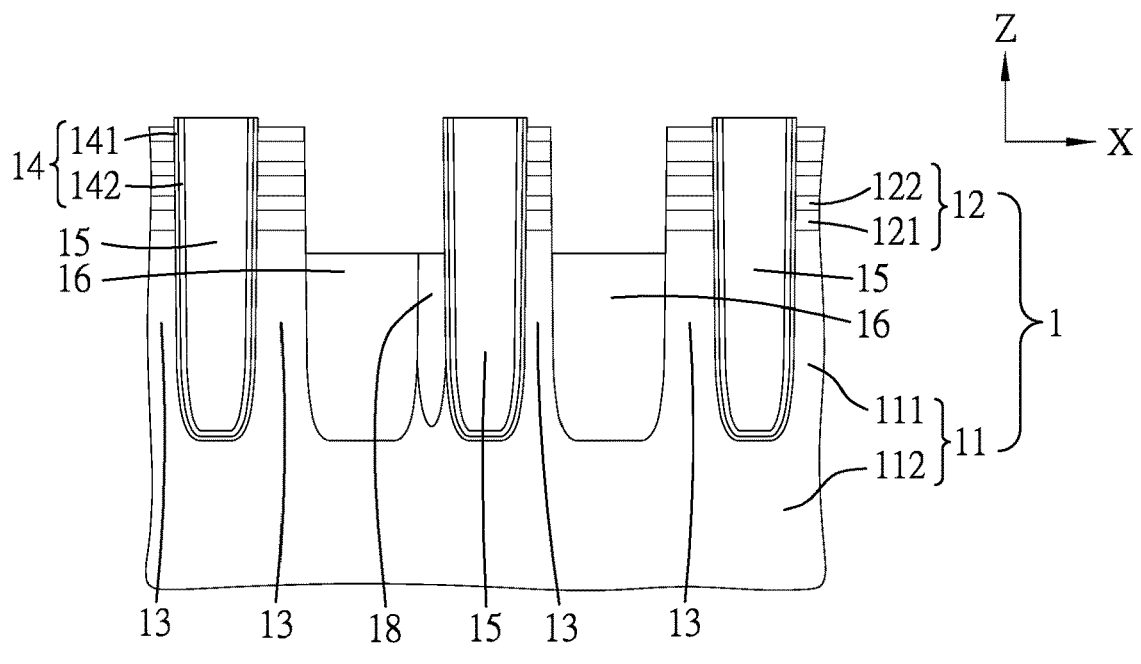

Referring to FIGS. 1A and 11, the method 100 then proceeds to step 110, where the isolation walls 16 and the dielectric feature 18 are partially removed. Step 110 may be performed by, for example, but not limited to, a dry etching process, a wet etching process, other suitable processes, or combinations thereof. Before this step, the uppermost one of the sacrificial layers 121 (see FIG. 10B) may be removed by, for example, but not limited to, a dry etching process, a wet etching process, other suitable processes, or combinations thereof. After this step, the dielectric feature 18 may be flush with or higher than the isolation walls 16.

Figure 12:
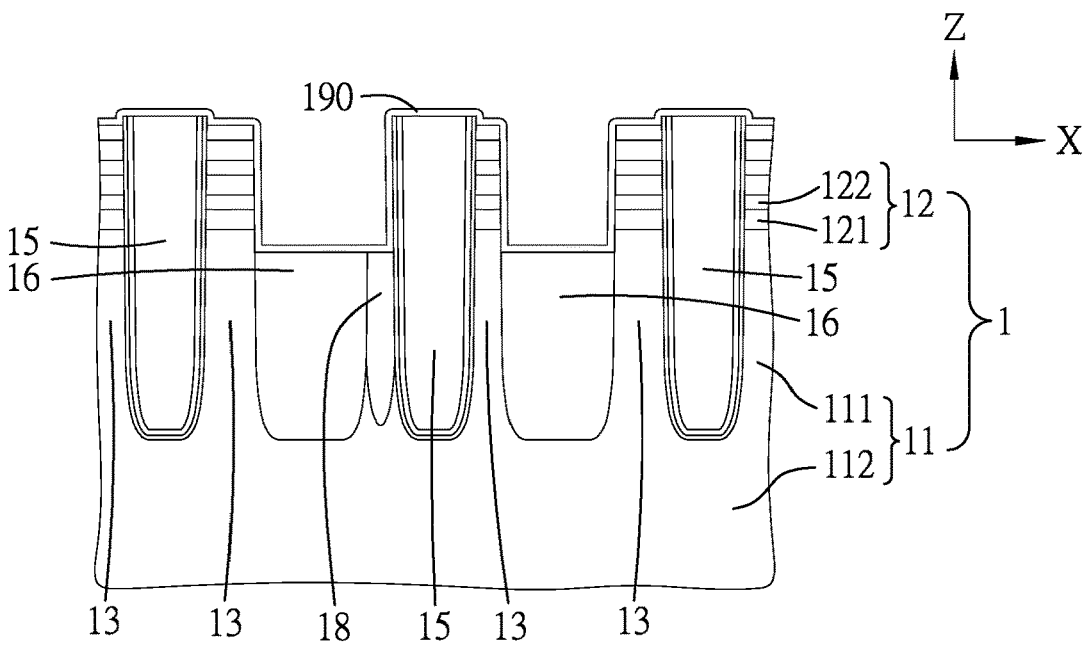

Referring to FIGS. 1B and 12, the method 100 then proceeds to step 111, where a second oxide layer 190 is conformally formed over the structure of FIG. 11. The material and process for forming the second oxide layer 190 are the same as or similar to those used for forming the first oxide layer 130 as described in step 102, and thus details thereof are omitted for the sake of brevity.

Figure 13:
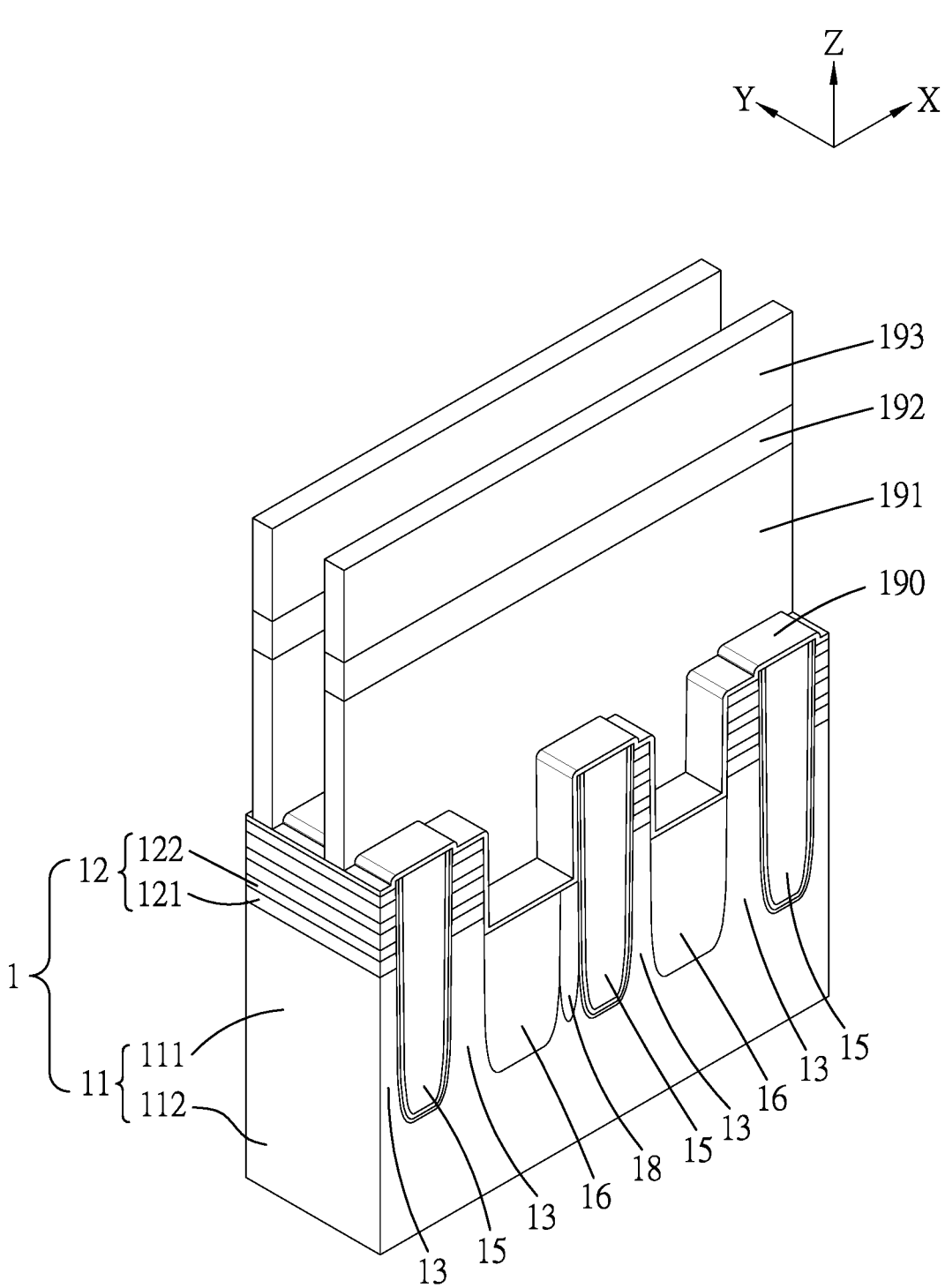

Referring to FIGS. 1B and 13, the method 100 then proceeds to step 112, where a dummy gate electrode layer 191, a sixth mask layer 192, and a seventh mask layer 193 are sequentially formed on the structure of FIG. 12 in the Z direction. The dummy gate electrode layer 191 may include polysilicon. Other suitable materials for the dummy gate electrode layer 191 are within the contemplated scope of the present disclosure. The dummy gate electrode layer 191 may be formed by a suitable deposition process, for example, but not limited to, CVD, physical vapor deposition (PVD), other suitable deposition processes, or combinations thereof. In some embodiments, the second oxide layer 190 may serve as a dummy gate dielectric layer, and cooperate with the dummy gate electrode layer 191 to serve as a dummy gate stack. The material and process for forming each of the sixth mask layer 192 and the seventh mask layer 193 are the same as or similar to those used for forming a corresponding one of the first mask layer 131 and the second mask layer 132 as described in step 102, and thus details thereof are omitted for the sake of brevity.

Figure 14:
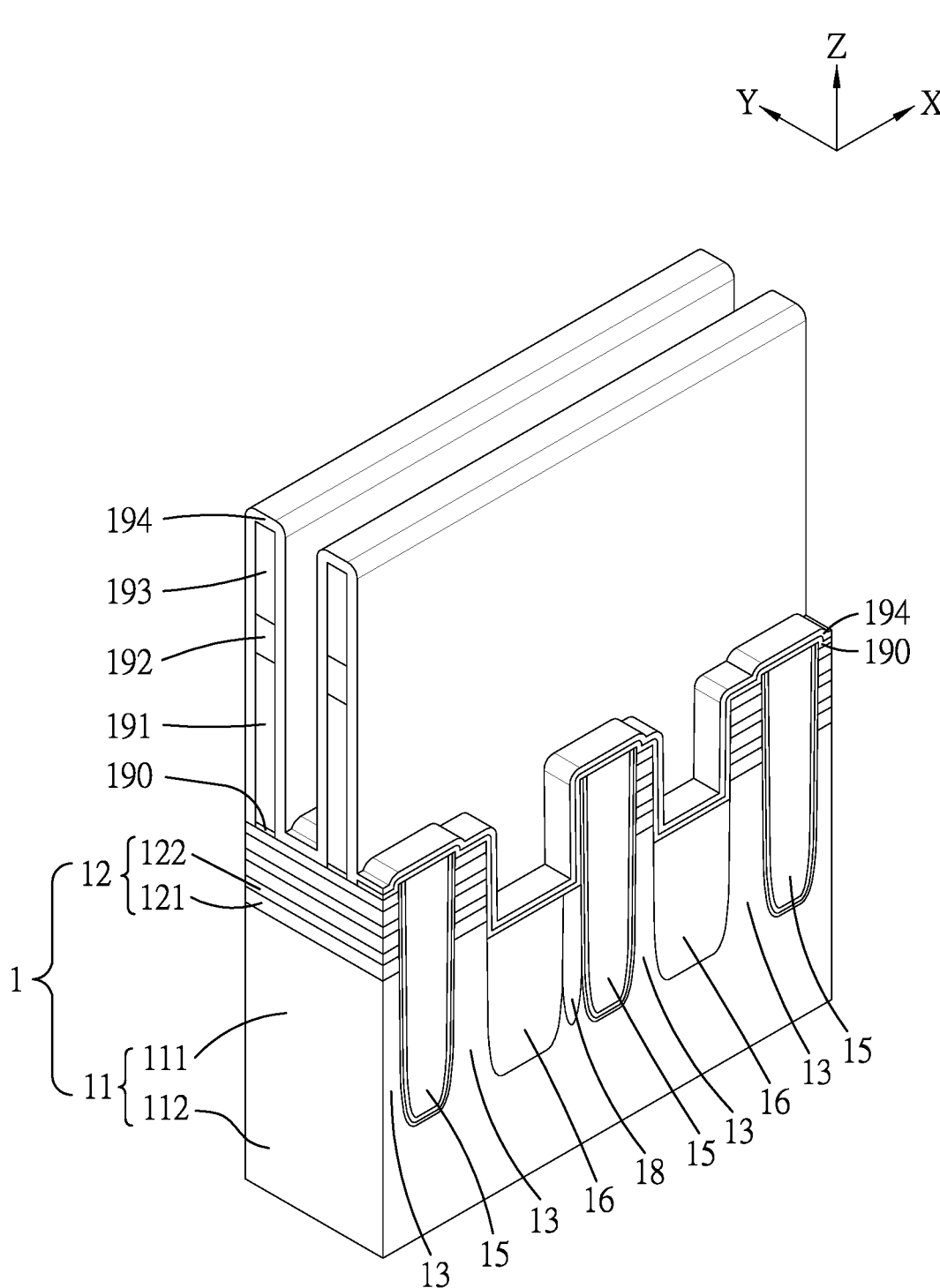

Referring to FIGS. 1B and 14, the method 100 then proceeds to step 113, where a gate spacer 194 is conformally formed over the structure of FIG. 13. Step 113 may include (i) depositing a spacer material layer over the structure of FIG. 13 by a suitable deposition process, for example, but not limited to, CVD, ALD, or other suitable deposition processes, and (ii) anisotropically etching the spacer material layer, so as to obtain the gate spacer 194. The spacer material layer for forming the gate spacer 194 may include silicon oxide, silicon carbide, silicon oxycarbide, silicon nitride, silicon oxynitride, silicon carbonitride, silicon oxy-carbonitride, and combinations thereof. Other suitable materials for the gate spacer 194 are within the contemplated scope of the present disclosure.

Figure 15:
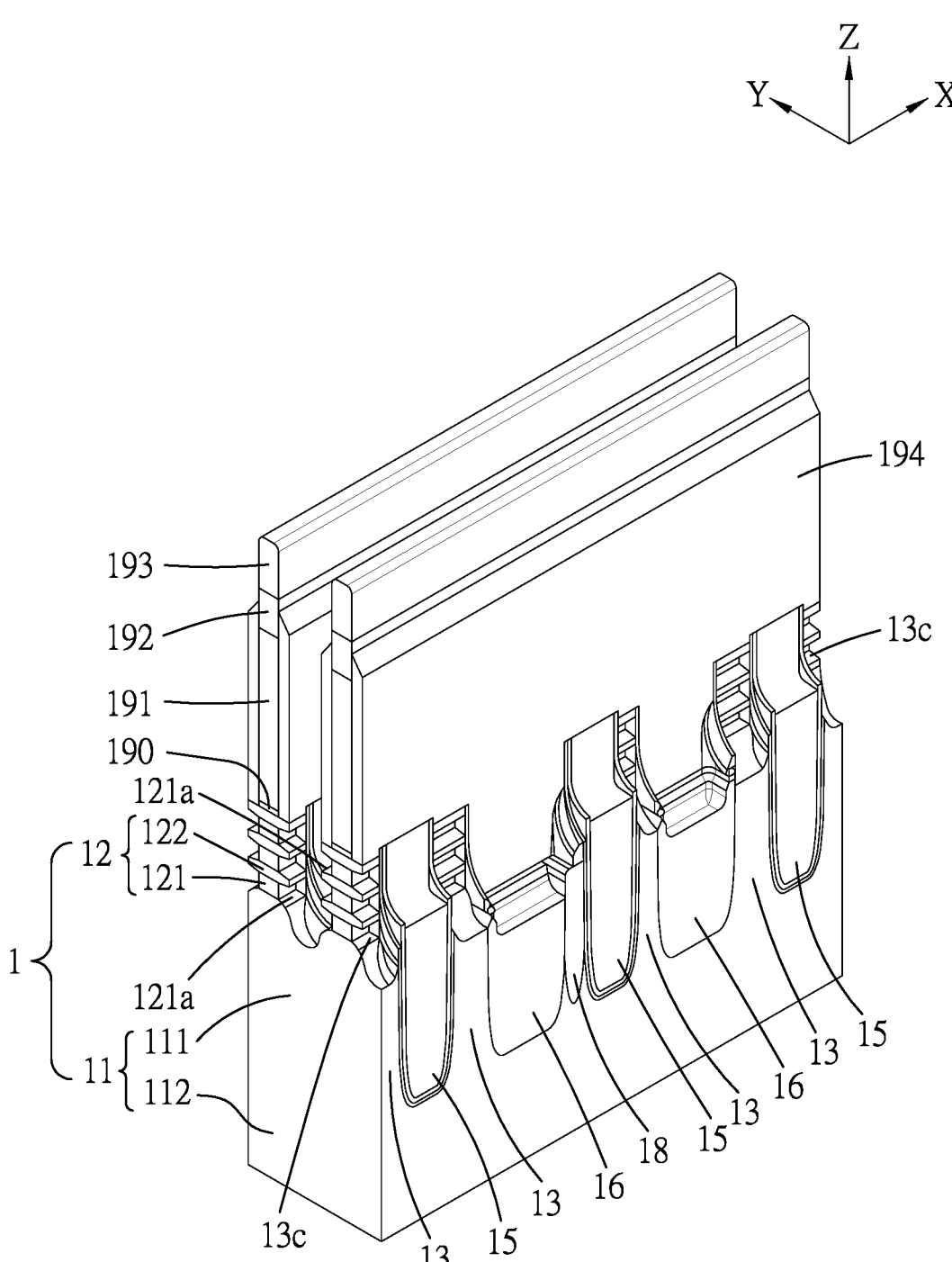

Referring to FIGS. 1B and 15, the method 100 then proceeds to step 114, where the fin-shaped structures 13, the liner layers 14, the dielectric walls 15, and the gate spacer 194 are partially etched, followed by partially etching the sacrificial layers 121 in a Y direction transverse to the X direction and the Z direction. In some embodiments, the fin-shaped structures 13, the liner layers 14, the dielectric walls 15, and the gate spacer 194 are partially etched by an anisotropically etching process (for example, dry etching), and source/drain recesses 13c are formed over regions of etched fin-shaped structures 13, respectively. In some embodiments, the sacrificial layers 121 exposed from the source/drain recesses 13c are selectively and partially etched to form inner spaces 121a. The sacrificial layers 121 may be etched by an isotropic etching process (for example, dry etching, wet etching or a combination thereof) since the sacrificial layers 121 have a relatively high etching selectivity with respect to the channel layers 122. After this step, each of the channel layers 122 may be referred to as a channel portion.

Figure 16:
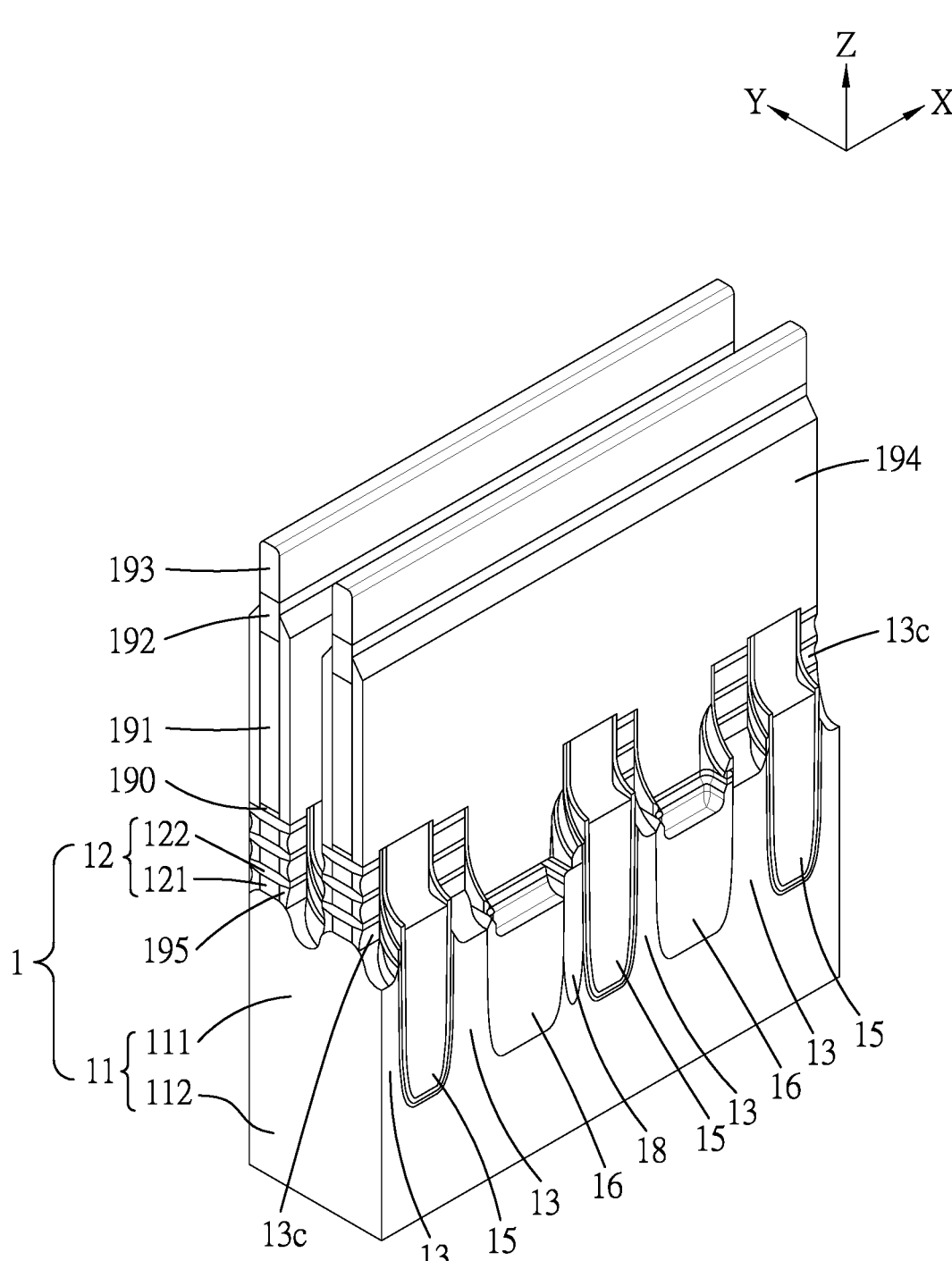

Referring to FIGS. 1B and 16, the method 100 then proceeds to step 115, where a plurality of inner spacers 195 are formed in the inner spaces 121a (see FIG. 15). Step 115 may include (i) conformally depositing a spacer material layer (not shown) over the structure of FIG. 15 and in the inner spaces 121a by a suitable deposition process, for example, but not limited to, CVD, ALD or other suitable deposition processes, and (ii) anisotropically etching (for example, dry etching or other suitable etching techniques) the spacer material layer to permit the inner spacers 195 to be respectively formed on the lateral sides of the etched sacrificial layers 121 and to be filled in the inner spaces 121a. The spacer material layer for forming the inner spacers 195 may include silicon oxide, silicon carbide, silicon oxycarbide, silicon nitride, silicon oxynitride, silicon carbonitride, silicon oxycarbonitride, and combinations thereof. Other suitable materials for the inner spacers 195 are within the contemplated scope of the present disclosure.

Figure 17:
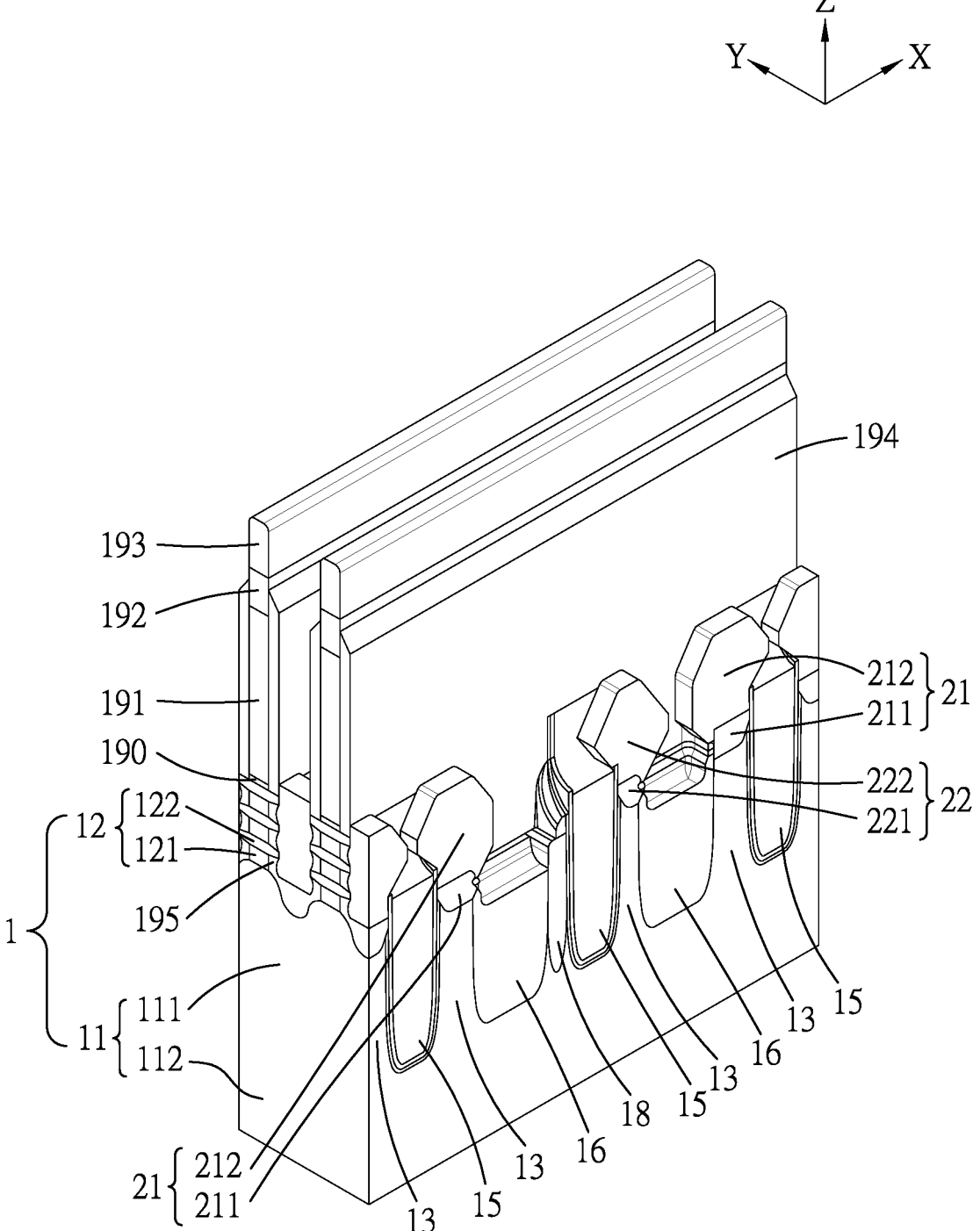

Referring to FIGS. 1B and 17, the method 100 then proceeds to step 116, where a plurality of first source/drain portions 21 are respectively formed on some of the source/drain recesses 13c (see FIG. 16) of the fin-shaped structures 13, and a plurality of second source/drain portions 22 are respectively formed on the remaining ones of the source/drain recesses 13c (see FIG. 16) of the fin-shaped structures 13.

In some embodiments, each of the first source/drain portions 21 includes a first epitaxial layer 211 and a second epitaxial layer 212 that are sequentially disposed on the source/drain recesses 13c of the fin-shaped structures 13. Each of the epitaxial layers 211, 212 may be a semiconductor epitaxial layer doped with an n-type impurity, for example, but not limited to, phosphorus. The semiconductor epitaxial layer may include silicon, silicon germanium, silicon carbide, germanium, III-V compound semiconductors, or combinations thereof. Other suitable materials for the epitaxial layers 211, 212 are within the contemplated scope of the present disclosure. In some embodiments, each of the first source/drain portions 21 is a source/drain portion of an n-type field effect transistor (n-FET). In some embodiments, a corresponding one of the dielectric walls 15 may be located between two adjacent n-FETs.

In some embodiments, each of the second source/drain portions 22 includes a first epitaxial layer 221 and a second epitaxial layer 222 that are sequentially disposed on the source/drain recesses 13c of the fin-shaped structures 13. In some embodiments, each of the epitaxial layers 221, 222 may be a semiconductor epitaxial layer doped with a p-type impurity, for example, but not limited to, boron. The semiconductor epitaxial layer may include silicon, silicon germanium, silicon carbide, germanium, III-V compound semiconductors, or combinations thereof. Other suitable materials for the epitaxial layers 221, 222 are within the contemplated scope of the present disclosure. In some embodiments, each of the second source/drain portions 22 is a source/drain portion of a p-type field effect transistor (p-FET). In some embodiments, a corresponding one of the dielectric walls 15 may be located between two adjacent p-FETs (not shown).

Figure 18:
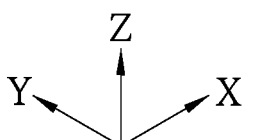
Figure 18:
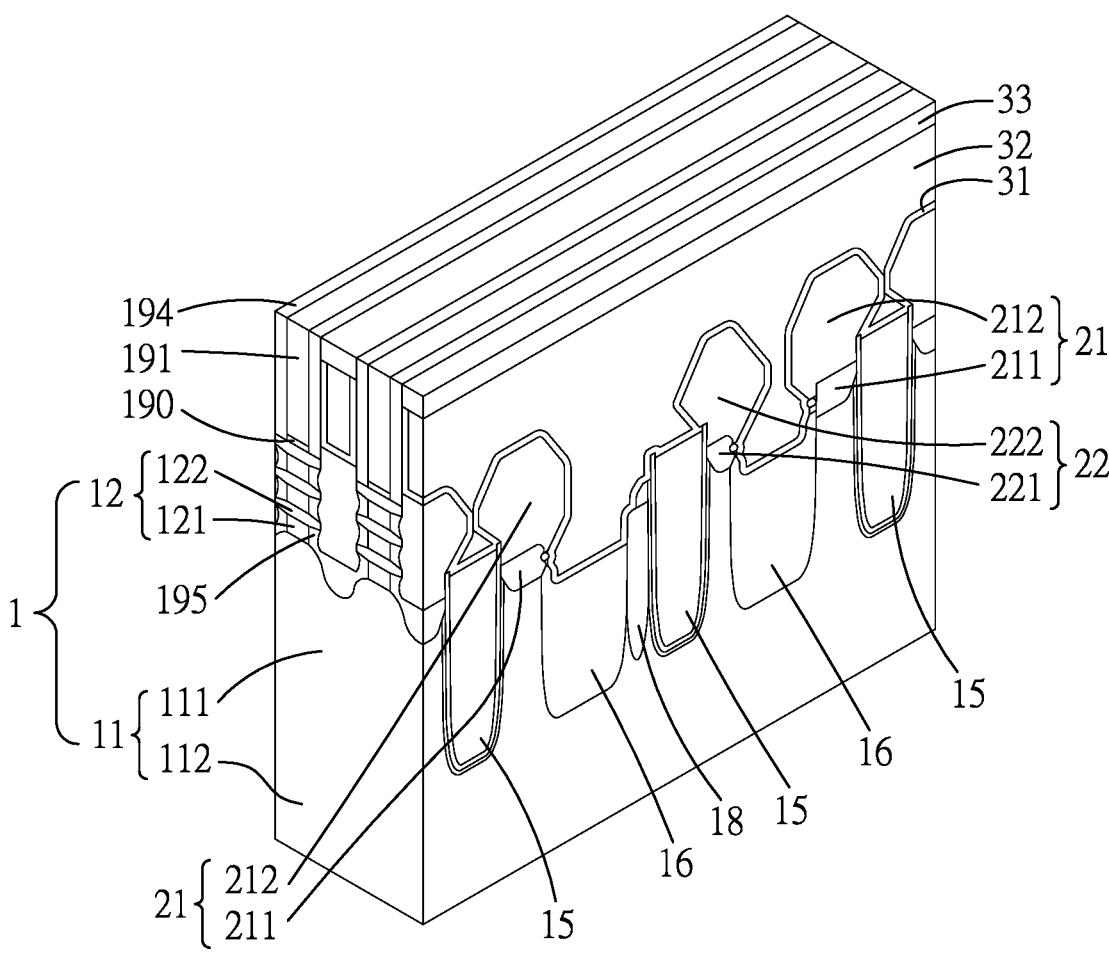

Referring to FIGS. 1B and 18, the method 100 then proceeds to step 117, where a contact etch stop layer (CESL) 31, an interlayer dielectric (ILD) layer 32 and a nitride layer 33 are sequentially formed over the structure of FIG. 17. Step 117 may include (i) conformally depositing the CESL 31 over the structure of FIG. 17, blanketly depositing the ILD layer 32 on the CESL 31, and further depositing the nitride layer 33 on the ILD layer 32, and (ii) conducting a planarization process, for example, but not limited to, CMP or other suitable planarization processes, thereby exposing the dummy gate stack. In other words, the sixth and seventh mask layers 192, 193 shown in FIG. 17 are also removed after the planarization process in step 117. The CESL 31 may include, for example, but not limited to, silicon oxide, silicon nitride, silicon oxynitride, other suitable materials, or combinations thereof. The CESL 31 may be formed by a suitable deposition process, for example, but not limited to, CVD (e.g., PECVD), ALD or other suitable deposition processes. The ILD layer 32 may include, for example, but not limited to, un-doped silicate glass (USG), doped silicon oxide, borophosphosilicate glass (BPSG), phosphosilicate glass (PSG), fused silica glass (FSG), boron doped silicon glass (BSG), tetraethylorthosilicate (TEOS) oxide, other suitable materials, or combinations thereof. The ILD layer 32 may be formed by a suitable deposition process, for example, but not limited to, CVD, spin-on coating or other suitable deposition processes. The nitride layer 33 may be a silicon nitride layer and is used to protect the ILD layer 32 from being damaged in the subsequent processes. The nitride layer 33 may be formed by a suitable deposition process, for example, but not limited to, CVD, ALD or other suitable deposition processes. Other suitable materials for forming the CESL 31, the ILD layer 32 and the nitride layer 33 are within the contemplated scope of the present disclosure.

Figure 19:
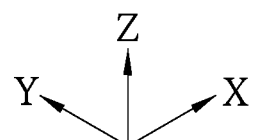
Figure 19:
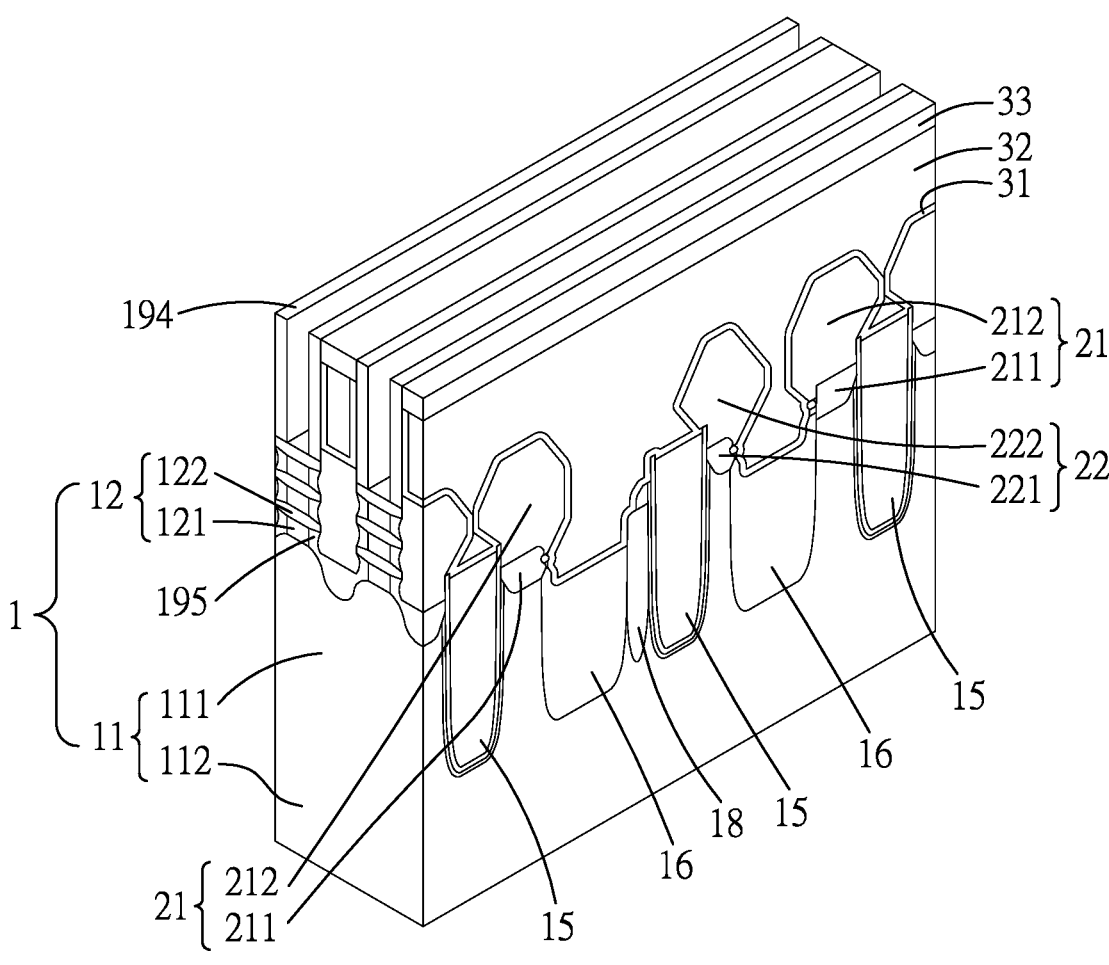

Referring to FIGS. 1B and 19, the method 100 then proceeds to step 118, where the dummy gate electrode layer 191 and the second oxide layer 190 are removed. Step 118 may be performed by a suitable etching process, for example, but not limited to, dry etching, wet etching, other suitable etching processes, or combinations thereof.

Figure 20A:
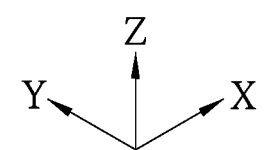
Figure 20A:
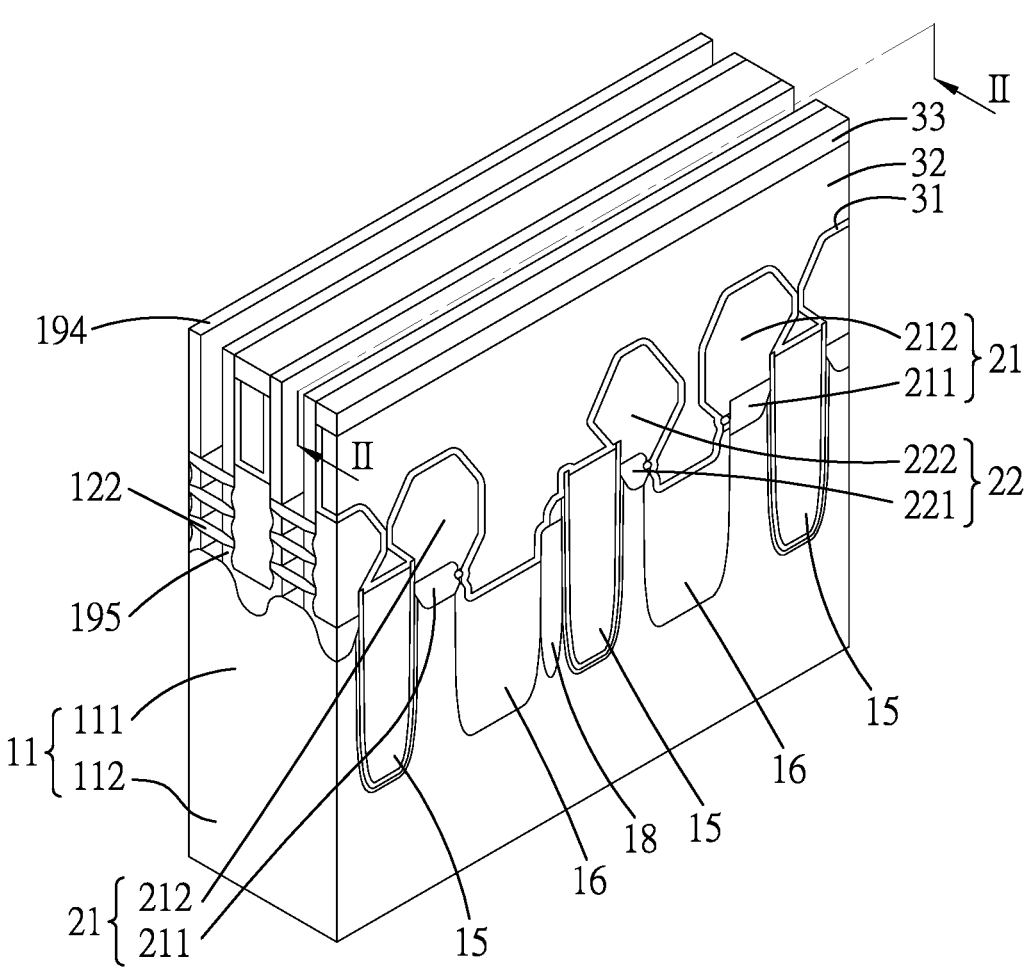
Figure 20B:
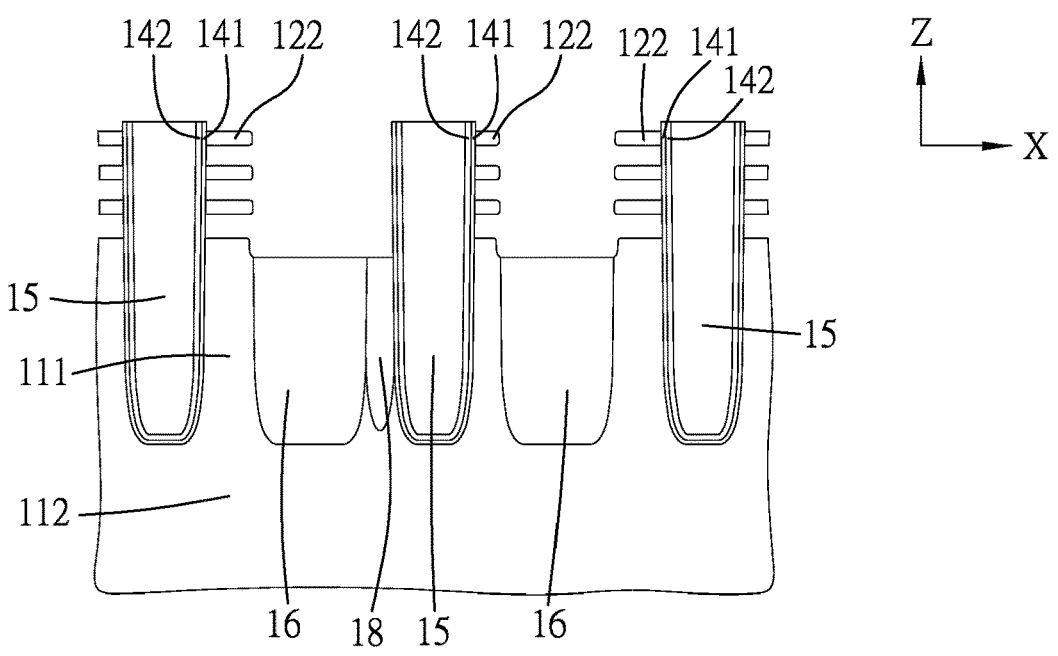

Referring to FIGS. 1B, 20A and 20B, the method 100 then proceeds to step 119, where the sacrificial layers 121 are removed. FIG. 20B illustrates a fragmentary cross-sectional view taken along line II-II of FIG. 20A. Step 119 may be performed by a suitable etching process, for example, but not limited to, dry etching, wet etching, other suitable etching processes, or combinations thereof. Step 119 may be referred to as a sheet formation process (the channel portions 122 resemble sheets).

Figure 21:
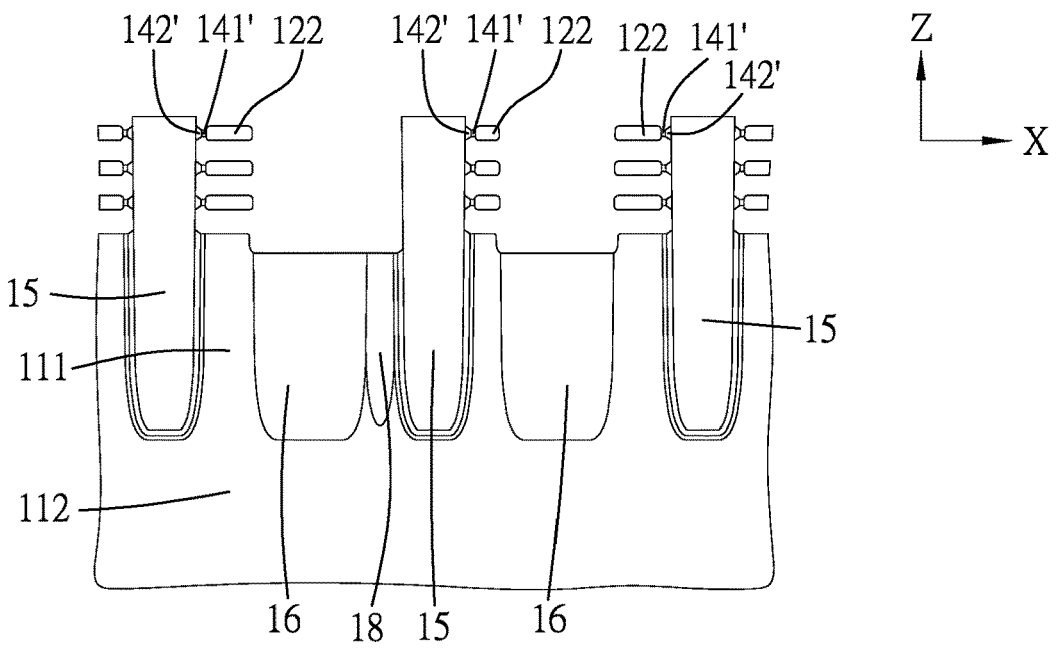

Referring to FIGS. 1B and 21, the method 100 then proceeds to step 120, where the first liner layers 141 and the second liner layers 142 are partially etched to form a plurality of first liners 141' and a plurality of second liners 142'. Each of the first liners 141' is disposed between a corresponding one of the channel portions 122 and a corresponding one of the second liners 142', and each of the second liners 142' is disposed between a corresponding one of the first liners 141' and a corresponding one of the dielectric walls 15. Step 120 may be performed by a suitable etching process, for example, but not limited to, dry etching, wet etching, other suitable etching processes, or combinations thereof.

Figures 22, 23:
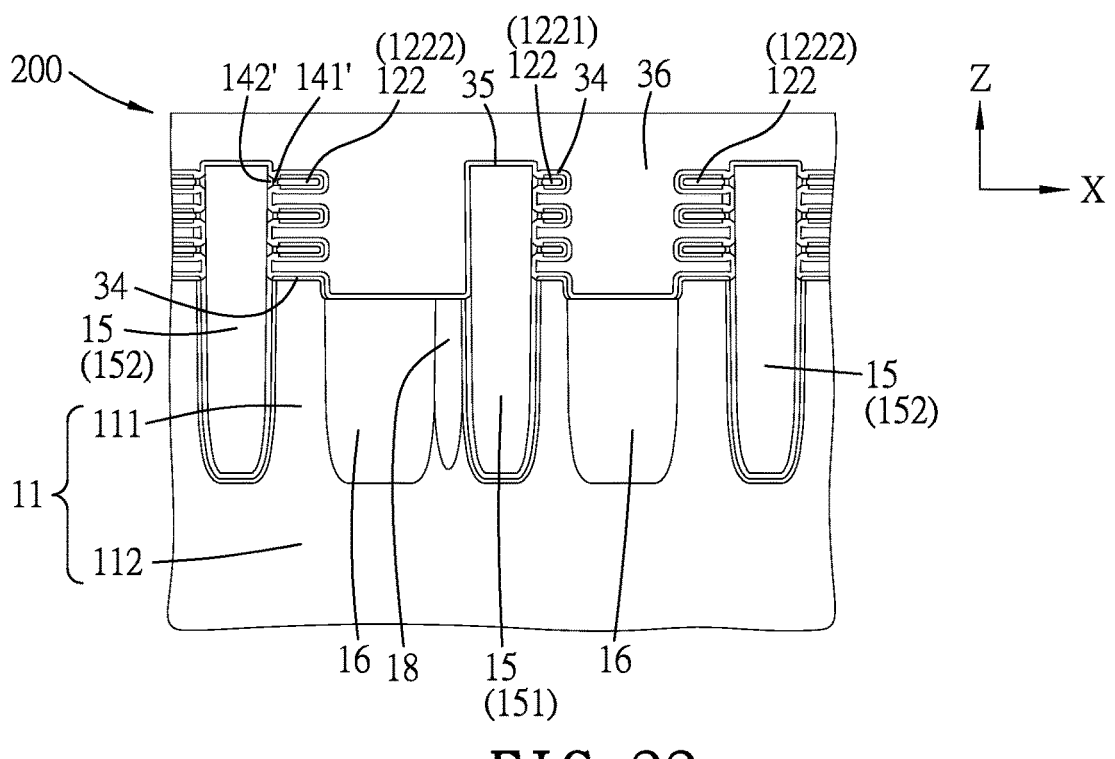
FIG. 23 is a schematic view illustrating a structure of a semiconductor memory device in accordance with some embodiments.

Referring to FIGS. 1B and 22, the method 100 then proceeds to step 121, where a plurality of interfacial layers 34, a gate dielectric layer 35, and a gate electrode layer 36 are sequentially formed on the structure of FIG. 21. Step 121 may include (i) conducting a pre-clean process to oxidize the exposed channel portions 122 so as to form the interfacial layers 34 to cover the channel portions 122 and a top surface of the upper portion 111 of the semiconductor substrate 11, respectively, and (ii) sequentially depositing the gate dielectric layer 35 and the gate electrode layer 36 on the interfacial layers 34 and other portions of the structure of FIG. 21 that is uncovered by the interfacial layers 34 by a suitable deposition process, for example, but not limited to, CVD, ALD or other suitable deposition processes. After this step, a planarization process (for example, CMP) may be performed to remove an excess of the gate electrode layer 36. In some embodiments, the pre-clean process for forming the interfacial layers 34 may be performed by one of RCA SC-1 (including ammonia, hydrogen peroxide and deionized water), RCA SC-2 (including hydrochloric acid, hydrogen peroxide and deionized water) and a combination thereof. Other suitable processes for forming the interfacial layers 34 are within the contemplated scope of the present disclosure. The interfacial layer 34 may include silicon oxide. The gate dielectric layer 35 may include hafnium oxide, silicon nitride, silicon oxynitride, titanium oxide, hafnium zirconium oxide, tantalum oxide, hafnium silicon oxide, zirconium oxide, zirconium silicon oxide, lanthanum oxide, aluminum oxide, yttrium oxide, strontium titanate, barium titanate, barium zirconate, lanthanum silicon oxide, aluminum silicon oxide, hafnium lanthanum oxide, hafnium silicon oxide, aluminum silicon oxide, hafnium tantalum oxide, hafnium titanium oxide, other suitable high-k materials, or combinations thereof. The gate electrode layer 36 may include aluminum, tungsten, copper, nickel, titanium, ruthenium, cobalt, platinum, other metal materials, a metal compound (for example, titanium nitride or tantalum nitride), a metal silicide, or combinations thereof. Other suitable materials for forming the interfacial layers 34, the gate dielectric layer 35 and the gate electrode layer 36 are within the contemplated scope of the present disclosure. After this step, a semiconductor memory device 200 is obtained.

In some embodiments, the dielectric walls 15 may be divided into a plurality of first dielectric walls 151 and a plurality of second dielectric walls 152, and the channel portions 122 can be divided into a plurality of first channel portions 1221 and a plurality of second channel portions 1222 (see FIG. 22). The first dielectric walls 151 and the second dielectric walls 152 are alternately arranged in the X direction, the first channel portions 1221 are disposed on a side of each of the first dielectric walls 151 and are spaced apart from each other in the Z direction, and the second channel portions 1222 are disposed on a side of each of the second dielectric walls 152 and are spaced apart from each other in the Z direction. Each of the isolation walls 16 is located between a corresponding one of the first dielectric walls 151 and a corresponding one of the second dielectric walls 152. The dielectric feature 18 is disposed to separate a corresponding one of the first dielectric walls 151 and a corresponding one of the isolation walls 16, and is disposed adjacent to the other side of the corresponding one of the first dielectric walls 151 opposite to the first channel portions 1221 disposed on the side of the corresponding one of the first dielectric walls 151. In some embodiments, the first channel portions 1221 may serve as channels of a p-type field effect transistor, and the second channel portions 1222 may serve as channels of an n-type field effect transistor.

FIG. 23 illustrates a schematic view of a semiconductor memory device 200A in accordance with some embodiments. The semiconductor memory device 200A is similar to the semiconductor memory device 200 except that the dielectric feature 18 is not partially removed, and thus, is higher than the isolation walls 16. The semiconductor device 200A may be made using a method 100A similar to the method 100 except that, in step 110, the dielectric feature 18 is not partially removed. In this case, the dielectric feature 18 may have a height ($H_2$) ranging from about 50 nm to about 150 nm.

In this disclosure, by having the dielectric feature 18 that is formed between a corresponding one of the dielectric walls 15 and a corresponding one of the isolation walls 16 through the COD-2 process, the structure and electrical performance (for example, the capacitance) of the semiconductor memory devices 200, 200A might not be adversely affected by process variations (for example, an overlay shift in a photolithography process).

In accordance with some embodiments of the present disclosure, a method for manufacturing a semiconductor memory device includes: forming a plurality of fin-shaped structures that are spaced apart from each other in a first direction; forming a plurality of dielectric walls that are spaced apart from each other in the first direction, each of the dielectric walls being located between corresponding two adjacent ones of the fin-shaped structures; forming a plurality of isolation walls that are spaced apart from each other in the first direction, each of the isolation walls being located between corresponding two adjacent ones of the dielectric walls and being separated from the corresponding two adjacent ones of the dielectric walls respectively by corresponding two of the fin-shaped structures; forming a mask layer on the fin-shaped structures, the dielectric walls and the isolation walls in a second direction transverse to the first direction; patterning the mask layer to form a first through hole that penetrates the mask layer to expose a portion of a corresponding one of the isolation walls, a portion of a corresponding one of the fin-shaped structures that is adjacent to the corresponding one of the isolation walls and a portion of a corresponding one of the dielectric walls that is separated from the corresponding one of the isolation walls by the corresponding one of the fin-shaped structures; etching the corresponding one of the fin-shaped structures to form a second through hole; and forming a dielectric layer to fill the second through hole, so as to form a dielectric feature in the second through hole.

In accordance with some embodiments of the present disclosure, each of the step of patterning the mask layer and the step of etching the corresponding one of the fin-shaped structures is conducted by a gas plasma etching process.

In accordance with some embodiments of the present disclosure, in the gas plasma etching process, a plasma generation power ranges from 500 W to 900 W.

In accordance with some embodiments of the present disclosure, in the gas plasma etching process, a gas plasma includes sulfur oxide ($SO_x$), fluorinated hydrocarbon ($CH_xF_y$), or argon (Ar).

In accordance with some embodiments of the present disclosure, in the gas plasma etching process, a gas flow rate ranges from 10 sccm to 500 sccm.

In accordance with some embodiments of the present disclosure, the dielectric feature includes an oxide-based material, silicon nitride, silicon carbonitride, silicon oxycarbonitride, or silicon oxycarbide.

In accordance with some embodiments of the present disclosure, the dielectric feature has a height ranging from 50 nm to 150 nm.

In accordance with some embodiments of the present disclosure, after formation of a dielectric layer to fill the second through hole, the method for manufacturing a semiconductor memory device further includes simultaneously etching the corresponding one of the isolation walls and the dielectric feature.

In accordance with some embodiments of the present disclosure, the etched dielectric feature has a width ranging from 10 nm to 100 nm, and has a height ranging from 10 nm to 100 nm.

In accordance with some embodiments of the present disclosure, each of the fin-shaped structures includes a plurality of sacrificial layers and a plurality of channel layers which are alternately stacked on a semiconductor substrate in the second direction, each of the sacrificial layers including silicon germanium, each of the channel layers including silicon.

In accordance with some embodiments of the present disclosure, a semiconductor memory device includes a dielectric wall, an isolation wall, a plurality of channel portions, and a dielectric feature. The isolation wall is spaced apart from the dielectric wall in a first direction. The channel portions are disposed on a side of the dielectric wall and are spaced apart from each other in a second direction transverse to the first direction. The dielectric feature is disposed between the dielectric wall and the isolation wall and is disposed on the other side of the dielectric wall opposite to the channel portions in the first direction.

In accordance with some embodiments of the present disclosure, the dielectric feature includes an oxide-based material, silicon nitride, silicon carbonitride, silicon oxycarbonitride, or silicon oxycarbide.

In accordance with some embodiments of the present disclosure, the dielectric feature has a height ranging from 10 nm to 150 nm.

In accordance with some embodiments of the present disclosure, the dielectric feature has a width ranging from 10 nm to 100 nm.

In accordance with some embodiments of the present disclosure, the channel portions serve as channels of one of an n-type field effect transistor and a p-type field effect transistor.

In accordance with some embodiments of the present disclosure, a semiconductor memory device includes a first dielectric wall, a second dielectric wall, a plurality of first channel portions, a plurality of second channel portions, an isolation wall, and a dielectric feature. The second dielectric wall is spaced apart from the first dielectric wall in a first direction. The first channel portions are disposed on a side of the first dielectric wall and are spaced apart from each other in a second direction transverse to the first direction. The second channel portions are disposed on a side of the second dielectric wall and are spaced apart from each other in the second direction. The isolation wall is located between the first dielectric wall and the second dielectric wall. The dielectric feature is disposed to separate the first dielectric wall and the isolation wall, and is disposed on the other side of the dielectric wall opposite to the first channel portions in the first direction.

In accordance with some embodiments of the present disclosure, the first channel portions serve as channels of a p-type field effect transistor.

In accordance with some embodiments of the present disclosure, the second channel portions serve as channels of an n-type field effect transistor.

In accordance with some embodiments of the present disclosure, an upper surface of the dielectric feature is located at a level that is not lower than an upper surface of the isolation wall.

In accordance with some embodiments of the present disclosure, the dielectric feature has a height ranging from 10 nm to 150 nm.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor memory device, comprising:

forming a plurality of fin-shaped structures that are spaced apart from each other in a first direction;

forming a plurality of dielectric walls that are spaced apart from each other in the first direction, each of the plurality of dielectric walls being located between corresponding two adjacent ones of the plurality of fin-shaped structures;

forming a plurality of isolation walls that are spaced apart from each other in the first direction, each of the plurality of isolation walls being located between corresponding two adjacent ones of the plurality of dielectric walls and being separated from the corresponding two adjacent ones of the plurality of dielectric walls respectively by corresponding two of the plurality of fin-shaped structures;

forming a mask layer to cover the plurality of fin-shaped structures, the plurality of dielectric walls and the plurality of isolation walls in a second direction transverse to the first direction;

patterning the mask layer to form a first through hole that penetrates the mask layer and that extends into a corresponding one of the plurality of dielectric walls, so as to expose a portion of a corresponding one of the plurality of isolation walls, a portion of a corresponding one of the plurality of fin-shaped structures that is adjacent to the corresponding one of the plurality of isolation walls, and the portion of a corresponding one of the plurality of dielectric walls that is separated from the corresponding one of the plurality of isolation walls by the corresponding one of the plurality of fin-shaped structures;

etching the corresponding one of the plurality of fin-shaped structures to form a second through hole; and forming a dielectric layer to fill the second through hole, so as to form a dielectric feature in the second through hole.

2. The method of claim 1, wherein patterning the mask layer and etching the corresponding one of the plurality of fin-shaped structures are each conducted by a gas plasma etching process.

3. The method of claim 2, wherein, in the gas plasma etching process, a plasma generation power ranges from 500 W to 900 W.

4. The method of claim 2, wherein, in the gas plasma etching process, a gas plasma includes sulfur oxide ($SO_x$), fluorinated hydrocarbon ($CH_xF_y$), or argon (Ar).

5. The method of claim 2, wherein, in the gas plasma etching process, a gas flow rate ranges from 10 sccm to 500 sccm.

6. The method of claim 1, wherein the dielectric feature includes an oxide-based material, silicon nitride, silicon carbonitride, silicon oxycarbonitride, or silicon oxycarbide.

7. The method of claim 1, wherein the dielectric feature has a height ranging from 50 nm to 150 nm.

8. The method of claim 1, after formation of a dielectric layer to fill the second through hole, further comprising simultaneously etching the corresponding one of the plurality of isolation walls and the dielectric feature.

9. The method of claim 8, wherein the etched dielectric feature has a width ranging from 10 nm to 100 nm, and has a height ranging from 10 nm to 100 nm.

10. The method of claim 1, wherein each of the plurality of fin-shaped structures includes a plurality of sacrificial layers and a plurality of channel layers which are alternately stacked on a semiconductor substrate in the second direction, each of the plurality of sacrificial layers including silicon germanium, each of the plurality of channel layers including silicon.

11. A method for manufacturing a semiconductor memory device, comprising:

forming a plurality of fin-shaped structures on a plurality of upper portions of a substrate, respectively, the plurality of fin-shaped structures being spaced apart from each other;

forming a plurality of dielectric walls on a lower portion of the substrate, the plurality of upper portions of the substrate being extended from the lower portion of the substrate, and being spaced apart from each other, each of the plurality of dielectric walls being located between corresponding two adjacent ones of the plurality of fin-shaped structures;

forming a plurality of isolation walls on the lower portion of the substrate, each of the plurality of isolation walls being located between corresponding two adjacent ones of the plurality of dielectric walls and being separated from the corresponding two adjacent ones of the plurality of dielectric walls respectively by corresponding two of the plurality of fin-shaped structures;

forming a mask structure to cover the plurality of fin-shaped structures, the plurality of dielectric walls and the plurality of isolation walls opposite to the substrate;

patterning the mask structure to form a first through hole that penetrates the mask structure to expose a portion of a corresponding one of the plurality of isolation walls, a portion of a corresponding one of the plurality of fin-shaped structures that is adjacent to the corresponding one of the plurality of isolation walls, and a portion of a corresponding one of the plurality of dielectric walls that is separated from the corresponding one of the plurality of isolation walls by the corresponding one of the plurality of fin-shaped structures;

etching a part of the portion of the corresponding one of the plurality of fin-shaped structures to form a second through hole that extends into the corresponding one of the plurality of fin-shaped structures; and forming a dielectric layer to fill the second through hole, so as to form a dielectric feature in the second through hole.

12. The method of claim 11, wherein the mask structure includes a lower mask layer, a middle mask layer, and an upper mask layer that are sequentially disposed on the plurality of fin-shaped structures, the plurality of dielectric walls and the plurality of isolation walls, and that are made of organosilicate-based material.

13. The method of claim 12, wherein the lower mask layer, the middle mask layer, and the upper mask layer have different silicon concentrations.

14. The method of claim 12, wherein the silicon concentration of the middle mask layer is greater than the silicon concentration of each of the lower mask layer and the upper mask layer.

15. A method for manufacturing a semiconductor memory device, comprising:

forming a plurality of fin-shaped structures that are spaced apart from each other in a first direction;

forming a plurality of dielectric walls that are spaced apart from each other in the first direction, each of the plurality of dielectric walls being located between corresponding two adjacent ones of the plurality of fin-shaped structures;

forming a plurality of isolation walls that are spaced apart from each other in the first direction, each of the plurality of isolation walls being located between corresponding two adjacent ones of the plurality of dielectric walls and being separated from the corresponding two adjacent ones of the plurality of dielectric walls respectively by corresponding two of the plurality of fin-shaped structures;

forming a mask layer to cover the plurality of fin-shaped structures, the plurality of dielectric walls, and the plurality of isolation walls in a second direction transverse to the first direction;

patterning the mask layer to form a first through hole that penetrates the mask layer to expose a portion of a corresponding one of the plurality of isolation walls, a portion of a corresponding one of the plurality of fin-shaped structures that is adjacent to the corresponding one of the plurality of isolation walls, and a portion of a corresponding one of the plurality of dielectric walls that is separated from the corresponding one of the plurality of isolation walls by the corresponding one of the plurality of fin-shaped structures;

etching the corresponding one of the plurality of fin-shaped structures to form a second through hole, a bottom of the second through hole being located at a level lower than a level of an upper surface of the portion of the corresponding one of the plurality of dielectric walls;

forming a dielectric layer to fill the second through hole, so as to form a dielectric feature in the second through hole; and removing the mask layer.

16. The method of claim 15, further comprising, after formation of the plurality of fin-shaped structures and before formation of the plurality of dielectric walls, forming a plurality of liner layers that surround the plurality of dielectric walls, respectively.

17. The method of claim 16, wherein a portion of a corresponding one of the plurality of liner layers that is separated from the corresponding one of the plurality of isolation walls by the corresponding one of the plurality of fin-shaped structures is exposed from the first through hole.

18. The method of claim 16, wherein each of the plurality of liner layers includes silicon nitride, silicon oxide, silicon oxynitride, silicon carbonitride, silicon oxycarbide, silicon oxycarbonitride, or combinations thereof.

19. The method of claim 1, wherein the first through hole further extends into the corresponding one of the plurality of isolation walls, so as to expose the portion of the corresponding one of the plurality of isolation walls.

20. The method of claim 11, wherein the dielectric feature extends into the corresponding one of the plurality of fin-shaped structures.

* * * * *